(12) United States Patent
Enomoto

(10) Patent No.: US 10,211,247 B2
(45) Date of Patent: Feb. 19, 2019

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Takayuki Enomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/830,246

(22) Filed: Dec. 4, 2017

(65) Prior Publication Data

US 2018/0097024 A1 Apr. 5, 2018

Related U.S. Application Data

(63) Continuation of application No. 15/407,381, filed on Jan. 17, 2017, now Pat. No. 9,871,071, which is a (Continued)

(30) Foreign Application Priority Data

Feb. 25, 2011 (JP) .................................. 2011-040531

(51) Int. Cl.
*H01L 27/146* (2006.01)
*H04N 5/374* (2011.01)
*H04N 5/378* (2011.01)

(52) U.S. Cl.
CPC ...... *H01L 27/1463* (2013.01); *H01L 27/1461* (2013.01); *H01L 27/1464* (2013.01); *H01L 27/14605* (2013.01); *H01L 27/14612* (2013.01); *H01L 27/14614* (2013.01); *H01L 27/14621* (2013.01); *H01L 27/14623* (2013.01); *H01L 27/14625* (2013.01); *H01L 27/14627* (2013.01); *H01L 27/14636* (2013.01); *H01L 27/14638* (2013.01); *H01L 27/14654* (2013.01);

(Continued)

(58) Field of Classification Search
CPC .............. H01L 27/1463; H01L 27/146; H01L 27/1464; H01L 27/14656; H01L 27/14614; H01L 27/30; H01L 27/3239; H01L 27/288; H01L 27/32; H01L 27/14621; H01L 27/14623; H01L 27/14627; H01L 27/14636; H01L 33/06; H01L 33/26; H01L 33/08; H01L 33/18; H01L 33/24; H01L 31/0232; H01L 31/143; H01L 31/162; H01L 31/18; H01L 51/5032; H01L 25/048
USPC ........................................................ 257/228
See application file for complete search history.

(56) References Cited

U.S. PATENT DOCUMENTS 9,871,071 B2 * 1/2018 Enomoto ............ H01L 27/1463

* cited by examiner

*Primary Examiner* — Chuong A Luu
(74) *Attorney, Agent, or Firm* — Sheridan Ross P.C.

(57) ABSTRACT

A solid-state imaging device includes a plurality of photoelectric conversion portions each provided in a semiconductor substrate and receives incident light through a light sensing surface, and a pixel separation portion provided to electrically separate a plurality of pixels. At least a pinning layer and a light shielding layer are provided in an inner portion of a trench provided on a side portion of each of the photoelectric conversion portions in an incident surface side, the trench includes a first trench and a second trench formed to be wider than the first trench in a portion shallower than the first trench, the pinning layer is formed in an inner portion of the first trench to cover an inside surface of the second trench, and the light shielding layer is formed to bury an inner portion of the second trench at least via the pinning layer.

20 Claims, 23 Drawing Sheets

Related U.S. Application Data continuation of application No. 15/239,679, filed on Aug. 17, 2016, now Pat. No. 9,576,996, which is a continuation of application No. 15/084,738, filed on Mar. 30, 2016, now Pat. No. 9,490,293, which is a continuation of application No. 14/573,904, filed on Dec. 17, 2014, now Pat. No. 9,577,002, which is a continuation of application No. 13/370,412, filed on Feb. 10, 2012, now Pat. No. 8,941,198.

(52) U.S. Cl.
CPC .. *H01L 27/14656* (2013.01); *H01L 27/14685* (2013.01); *H01L 27/14687* (2013.01); *H01L 27/14689* (2013.01); *H04N 5/374* (2013.01); *H04N 5/378* (2013.01)

SOLID-STATE IMAGING DEVICE, MANUFACTURING METHOD THEREOF, AND ELECTRONIC APPARATUS

CROSS-REFERENCE TO RELATED APPLICATIONS

This application is a continuation of U.S. patent application Ser. No. 15/407,381, filed Jan. 17, 2017 now U.S. Pat. No. 9,871,071, which is a continuation of U.S. patent application Ser. No. 15/239,679, filed Aug. 17, 2016, now U.S. Pat. No. 9,576,996, which is a continuation of U.S. patent application Ser. No. 15/084,738, filed Mar. 30, 2016, now U.S. Pat. No. 9,490,293, which is a continuation of U.S. patent application Ser. No. 14/573,904, filed Dec. 17, 2014, now U.S. Pat. No. 9,577,002, which is a continuation of U.S. patent application Ser. No. 13/370,412, filed Feb. 10, 2012, now U.S. Pat. No. 8,941,198, which claims priority to Japanese Patent Application No. JP 2011-040531, filed in the Japan Patent Office on Feb. 25, 2011, the entire disclosures of which are hereby incorporated herein by reference.

BACKGROUND

The present disclosure relates to a solid-state imaging device, a manufacturing method thereof, and an electronic apparatus.

Electronic apparatuses such as a digital video camera or a digital still camera include a solid-state imaging device. For example, the solid-state imaging device includes a CMOS (Complementary Metal Oxide Semiconductor) type image sensor or a CCD (Charge Coupled Device) type image senor.

In the solid-state imaging device, a plurality of pixels are arranged on a pixel region of a substrate. A photoelectric conversion portion is provided on each pixel. For example, the photoelectric conversion portion is a photodiode, and receives incident light through the light sensing surface and generates a signal charge by performing a photoelectric conversion with respect to the received light.

Among the solid-state imaging devices, in the CCD type image sensor, a vertical transfer portion is provided between a plurality of pixel columns which are vertically lined up in a pixel region. In the vertical transfer portion, a plurality of transfer electrodes are provided so as to be facing a vertical channel region through gate insulating films, and the vertical transfer portion is configured so as to transfer the signal charge, which is read from the photoelectric conversion portion by a charge readout portion, in a vertical direction.

In contrast, in the CMOS type image sensor, pixels are configured so as to include a pixel transistor in addition to the photoelectric conversion portion. The pixel transistor is configured so as to read the signal charge generated by the photoelectric conversion portion and output the read signal charge to a signal line as an electric signal.

In general, the solid-state imaging device is provided on a front surface side in which a multilayer wiring layer on which a plurality of wirings are laminated is provided in a substrate, and a photoelectric conversion portion receives light incident from the front surface side through a light sensing surface.

In the case of the "front surface illumination type", the thick multilayer wiring layer is disposed between a microlens and the light sensing surface. Thereby, when light enters in an inclined state with respect to the light sensing surface, the light is shielded by the wirings included in the multilayer wiring layer, and the light may not reach the light sensing surface JS. In addition, the incident light dose not enter the photodiode of the pixel just below the light, and may enter the photodiodes of other pixels. Thereby, disadvantages such as shading or a color mixing may be generated in the captured image. Moreover, besides this, it may be difficult to improve sensitivity.

Therefore, "a rear surface illumination type" has been suggested in which the photoelectric conversion portion receives the light incident from a rear surface side which is a side opposite to the front surface on which the multilayer wiring layer is provided in the substrate. However, also in the "rear surface illumination type", the incident light entering one pixel may not enter the photodiode of this one pixel and enter photodiodes of the adjacent other pixels. Thereby, noise is included in the signal due to the optical phenomenon, a disadvantage such as "color mixing" is generated in the captured image, and quality of the captured image may be decreased. In order to suppress occurrence of the disadvantage, light shielding films are provided between a plurality of pixels (for example, refer to Japanese Unexamined Patent Application Publication Nos. 2010-109295 and 2010-186818).

Moreover, in the solid-state imaging device, in order to suppress a dark current from being generated due to an interface state of the semiconductor substrate on which the photoelectric conversion portion is provided, the photoelectric conversion portion including an HAD (Hole Accumulation Diode) structure has been suggested. In the HAD structure, since a positive charge (hole) accumulation region is formed on the light sensing surface of a n-type charge accumulation region, occurrence of the dark current is suppressed.

In addition, in order to form the positive charge accumulation region in the interface portion of the photoelectric conversion portion, suppressing occurrence of the dark current by providing "a film having a negative fixed charge" as a pinning layer has been suggested. For example, a high dielectric constant film such as a hafnium oxide film ($HfO_2$ film) may be used as the "film having a negative fixed charge" (for example, refer to Japanese Unexamined Patent Application Publication No. 2008-306154 or the like).

Moreover, in the solid-state imaging device, in order to prevent the signals output from each pixel from being mixed by electric noise, a pixel separation portion which electrically separates a plurality of pixels is provided. For example, a high concentration impurity region, which is formed by ion-implanting impurities of a high concentration to the semiconductor substrate, is provided on the pixel separation portion.

SUMMARY

FIG. 23 is a cross-sectional diagram illustrating main portions of a pixel P in the CMOS image sensor of the "rear surface illumination type".

As illustrated in FIG. 23, in the CMOS image sensor of the "rear surface illumination type", a photodiode 21 is provided in a portion which is divided by a pixel separation portion 101pb in the inner portion of a semiconductor substrate 101. In the photodiode 21, an n-type semiconductor region 101n is formed as a charge accumulation region. The photodiode 21 is an HAD structure, and the n-type semiconductor region 101n is formed so as to be interposed between p-type semiconductor regions 101pa and 101pc in the depth direction z of the semiconductor substrate 101. In addition, the pixel separation portion 101pb is formed by ion-implanting p-type impurities with high concentration to the semiconductor substrate 101.

Although not illustrated in FIG. 23, a pixel transistor is provided on the front surface (lower surface in FIG. 23) of the semiconductor substrate 101, and as illustrated in FIG. 23, a wiring layer 111 is provided so as to cover the pixel transistor. The wiring layer 111 is formed so that wirings 111h are covered by an insulating layer 111z. In addition, a supporting substrate SS is provided on the front surface (lower surface) of the wiring layer 111.

In contrast, a light shielding film 60, a color filter CF, and a microlens ML are provided on the rear surface (upper surface in FIG. 23) of the semiconductor substrate 101, and the photodiode 21 receives the incident light H which enters via each of the portions.

Here, as illustrated in FIG. 23, for example, the light shielding film 60 is formed on the upper surface of the semiconductor substrate 101 via an insulating film SZ which is a silicon oxide film. The light shielding film 60 is provided above the pixel separation portion 101pb provided in the inner portion of the semiconductor substrate 101. For example, the light shielding film 60 is formed by using a light shielding material such as metal.

Moreover, the upper surface of the light shielding film 60 is covered by a planarized film HT, and the color filter CF and the microlens ML are provided on the upper surface of the planarized film HT. For example, in the color filter CF, each filter layer of three primary colors is arranged for each pixel P in a Bayer array.

However, in the case of the above-described configuration, in order to the light shielding film 60, the distance between the light sensing surface JS and the microlens ML becomes longer. Thereby, a focusing property of the microlens ML may be deteriorated, and quality of the captured image may be decreased.

Moreover, although the light shielding film 60 is formed, since the incident light H entering one pixel P is transmitted below the light shielding film 60 and enters the photodiodes 21 of the adjacent other pixels P, quality of the captured image may be decreased.

Particularly, when the incident light H enters in a largely inclined state, the incident light H may pass through the pixel separation portion 101pb which is formed by the ion implantation of impurities having a high concentration and may enter the photodiodes 21 of the adjacent other pixels P. Thereby, a so-called "color mixing" may be generated, and color reproducibility in the captured color image may be decreased. In addition, quality of the captured image may be decreased due to occurrence of the "shading".

In this way, in the solid-state imaging device, it may be difficult to sufficiently improve quality of the captured image due to occurrence of optical noise by leakage of the inclined light.

Besides this, when the pixel separation portion 101pb is formed by ion-implanting impurities, the width of the pixel separation portion 101pb is widened with consideration for diffusion of the impurities or the like. Thereby, it may be difficult to widen the occupancy area of the photodiode 21. Therefore, a saturation charge accumulation amount (Qs) of the photodiode 21 is decreased, and it may be difficult to improve the quality of the captured image.

The above described disadvantages are not limited to the case of the "rear surface illumination type" and may be also generated in the case of the "front surface illumination type" solid-state imaging device.

In this way, in the solid-state imaging device, it may be difficult to improve quality of the captured image due to various factors.

Therefore, it is desirable to provide a solid-state imaging device, a manufacturing method thereof, and an electronic apparatus capable of improving quality or the like of a captured image.

According to an embodiment of the present disclosure, there are provided a solid-state imaging device and an electronic apparatus which include a plurality of photoelectric conversion portions each provided to correspond to each of a plurality of pixels in a semiconductor substrate and receives incident light through a light sensing surface, and a pixel separation portion that is provided between the plurality of pixels in an inner portion of the semiconductor substrate and electrically separates the plurality of pixels, wherein at least a pinning layer and a light shielding layer are provided in an inner portion of a trench which is provided on a side portion of each of the photoelectric conversion portions in an incident surface side of the semiconductor substrate into which the incident light enters, the trench includes a first trench and a second trench having a width wider than that of the first trench in a portion shallower than the first trench in the semiconductor substrate, the pinning layer is formed in an inner portion of the first trench so as to cover an inside surface of the second trench, and the light shielding layer is formed so as to bury an inner portion of the second trench at least via the pinning layer.

According to another embodiment of the present disclosure, there is provided a method of manufacturing a solid-state imaging device which includes providing a plurality of photoelectric conversion portions which receive incident light through a light sensing surface so as to correspond to a plurality of pixels in a semiconductor substrate, and forming a pixel separation portion, which electrically separates the plurality of pixels, between the plurality of pixels in an inner portion of the semiconductor substrate, the forming of the pixel separation includes providing at least a pinning layer and a light shielding layer in an inner portion of a trench which is provided on a side portion of each of the photoelectric conversion portions in an incident surface side of the semiconductor substrate into which the incident light enters, a first trench and a second trench having a width wider than that of the first trench in a portion shallower than the first trench in the semiconductor substrate are formed as the trench, the pinning layer is formed so as to cover an inner portion of the first trench and an inside surface of the second trench, and the light shielding layer is formed so as to bury an inner portion of the second trench at least via the pinning layer.

According to the embodiments of the present disclosure, the first trench and the second trench having the width wider than that of the first trench in the portion shallower than the first trench in the semiconductor substrate are formed as the trench in the pixel separation portion. Moreover, the pinning layer is formed in an inner portion of the first trench so as to cover an inside surface of the second trench. In addition, the light shielding layer is formed so as to bury an inner portion of the second trench at least via the pinning layer. By configuring the pixel separation portion in this way, the pixel separation portion electrically and optically separates the plurality of pixels.

According to the present disclosure, it is possible to provide a solid-state imaging device, a manufacturing method thereof, and an electronic apparatus capable of improving quality or the like of the captured image.

DETAILED DESCRIPTION OF EMBODIMENTS

Embodiments of the present disclosure will be described with reference to the drawings.

In addition, description is performed in the following order.

1. First Embodiment (Case of Rear Surface Illumination Type)
2. Second Embodiment (Case Where Manufacturing Method is Partially Different from First Embodiment)
3. Third Embodiment (Case Where Insulating film and Pinning Layer are Provided in Trench of Lower Portion)
4. Fourth Embodiment (Case Where Depth of Trench is Different According to Wavelength of Received Light)
5. Fifth Embodiment (Case of Front Surface Illumination Type)
6. Others 1. First Embodiment (A) Apparatus Configuration (A-1) Main Portion Configuration of Camera FIG. 1 is a configuration diagram illustrating a configuration of a camera 40 in a first embodiment.

Figure 1:
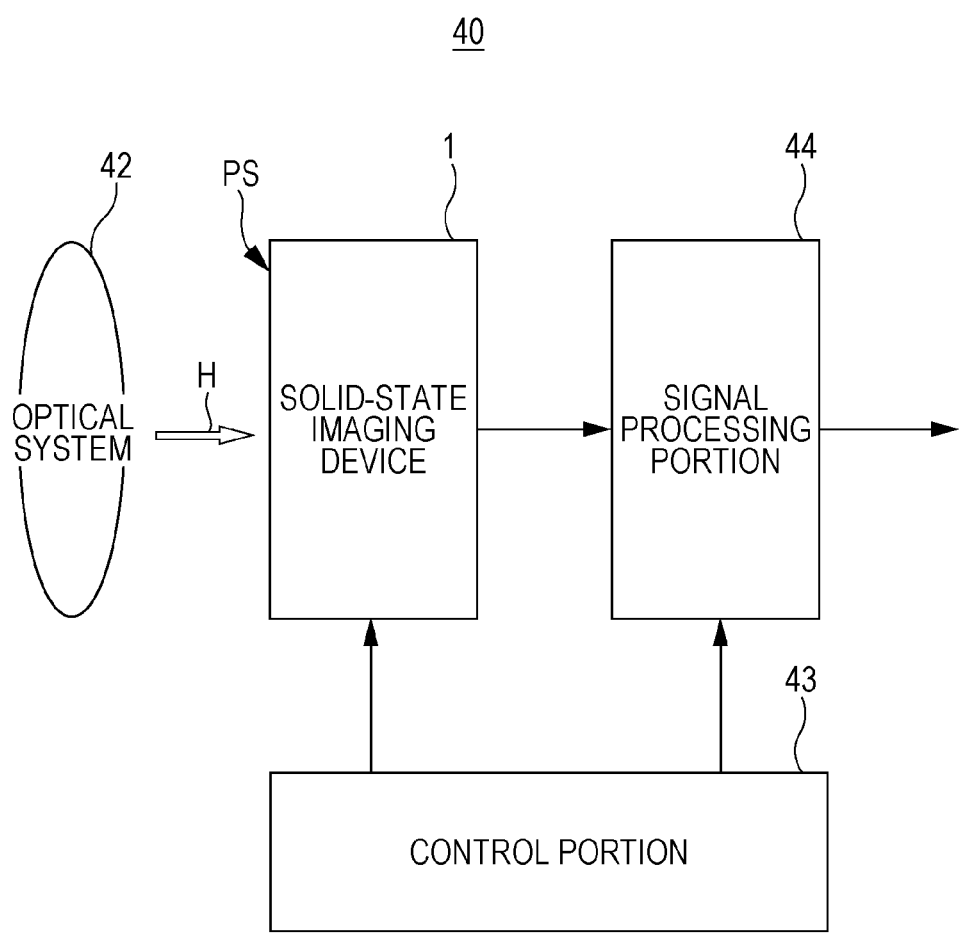
FIG. 1 is a configuration diagram illustrating a configuration of a camera in a first embodiment.

As illustrated in FIG. 1, the camera 40 includes a solid-state imaging device 1, an optical system 42, a control portion 43, and a signal processing portion 44. Each portion will be sequentially described.

The solid-state imaging device 1 receives incident light H, which enters as a subject image via the optical system 42, through an imaging surface PS, performs a photoelectric conversion with respect to the received light, and generates a signal charge. Here, the solid-state imaging device 1 reads the signal charge by being driven based on a control signal output from the control portion 43, and outputs an electric signal.

The optical system 42 includes optical members such as an imaging lens or an aperture and is disposed so as to focus the incident light H on the imaging surface PS of the solid-state imaging device 1.

The control portion 43 outputs various control signals to the solid-state imaging device 1 and the signal processing portion 44, and controls and drives the solid-state imaging device 1 and the signal processing portion 44.

The signal processing portion 44 is configured so as to generate a digital image with respect to the subject image by performing a signal processing while having the electric signal output from the solid-state imaging device 1 as a raw data.

(A-2) Main Portion Configuration of Solid-State Imaging Device

The entire configuration of the solid-state imaging device 1 will be described.

Figure 2:
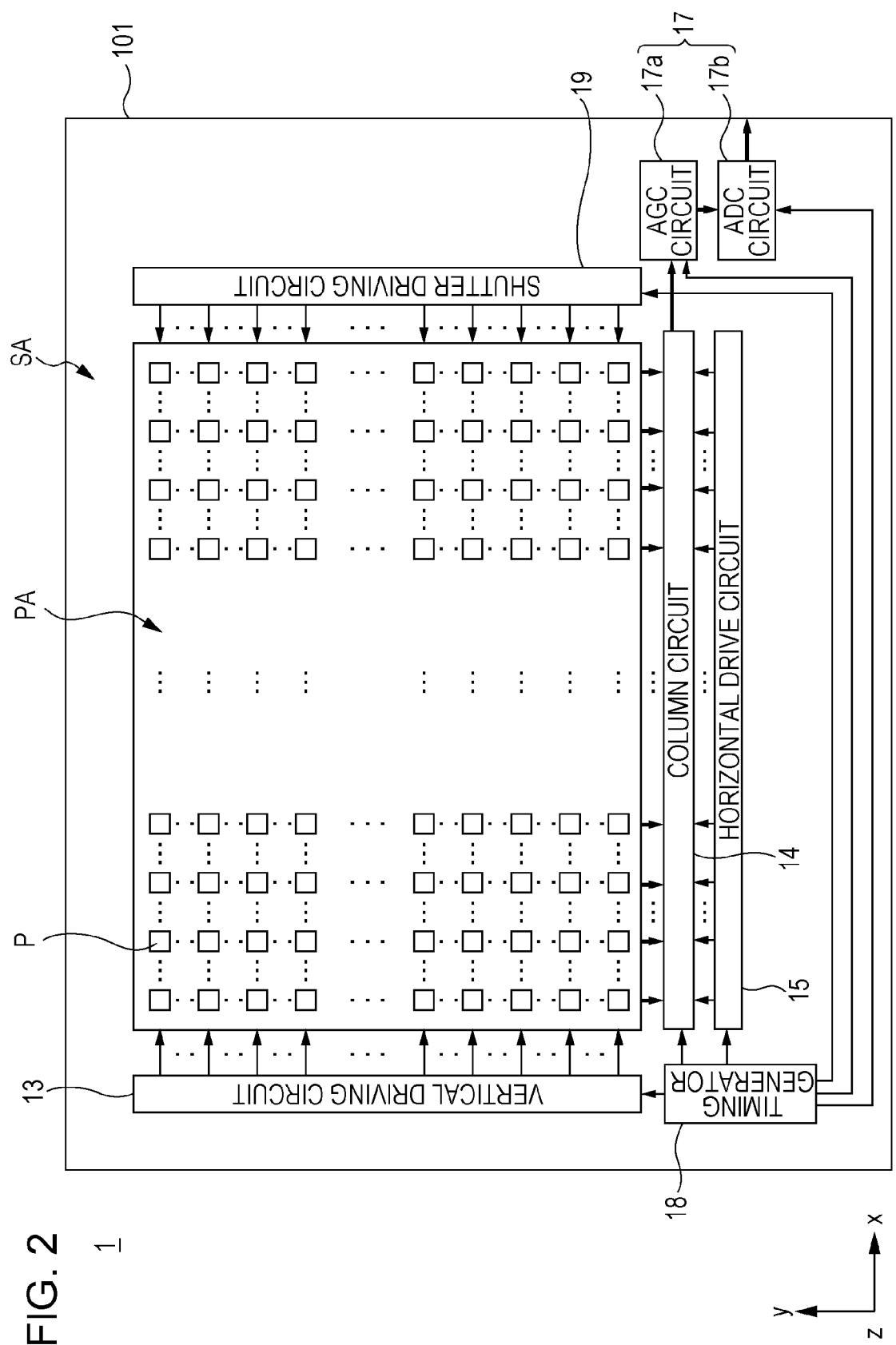
FIG. 2 is a diagram illustrating the entire configuration of a solid-state imaging device in the first embodiment.

FIG. 2 is a diagram illustrating the entire configuration of a solid-state imaging device 1 in a first embodiment of the present disclosure.

The solid-state imaging device 1 of the present embodiment is a CMOS type image sensor and includes a semiconductor substrate 101 as illustrated in FIG. 2. For example, the semiconductor substrate 101 may be formed by thinning a single crystal silicon semiconductor substrate, and a pixel region PA and a peripheral region SA are provided on the surface of the semiconductor substrate.

As illustrated in FIG. 2, the pixel region PA is a rectangular shape, and a plurality of pixels P are disposed in each of a horizontal direction x and a vertical direction y. That is, the pixels P are lined up with a matrix form.

In the pixel region PA, the pixels P are configured so as to receive the incident light and generate the signal charge. Moreover, the generated signal charge is read by a pixel transistor (not illustrated) and output as an electric signal. The detailed configuration of the pixels P will be described hereinafter.

As illustrated in FIG. 2, the peripheral region SA is positioned in the periphery of the pixel region PA. Moreover, a peripheral circuit is provided in the peripheral region SA.

Specifically, as illustrated in FIG. 2, a vertical drive circuit 13, a column circuit 14, a horizontal drive circuit 15, an external output circuit 17, a timing generator (TG) 18, and a shutter drive circuit 19 are provided as the peripheral circuit.

As illustrated in FIG. 2, the vertical drive circuit 13 is provided at the side portion of the pixel region PA in the peripheral region SA, and the vertical drive circuit is configured so as to select and drive the pixels P of the pixel region PA by a row unit.

As illustrated in FIG. 2, the column circuit 14 is provided at the lower end of the pixel region PA in the peripheral region SA, and performs a signal processing with respect to the signal which is output from the pixels P by a column unit. Here, the column circuit 14 includes a CDS (Correlated Double Sampling) circuit (not illustrated) and performs a signal processing which removes a fixed pattern noise.

As illustrated in FIG. 2, the horizontal drive circuit 15 is electrically connected to the column circuit 14. For example, the horizontal drive circuit 15 includes a shift register and sequentially outputs the signal, which is held for each column of the pixels P in the column circuit 14, to the external output circuit 17.

As illustrated in FIG. 2, the external output circuit 17 is electrically connected to the column circuit 14. In addition, after the external output circuit 17 performs a signal processing with respect to the signal output from the column circuit 14, the external output circuit outputs the processed signal to the external. The external output circuit 17 includes an AGC (Automatic Gain Control) circuit 17a and an ADC circuit 17b. In the external output circuit 17, after the AGC circuit 17a multiplies the signal by a gain, the ADC circuit 17b converts the analog signal to the digital signal and outputs the converted signal to the external.

As illustrated in FIG. 2, the timing generator 18 is electrically connected to the vertical drive circuit 13, the column circuit 14, the horizontal drive circuit 15, the external output circuit 17, and the shutter drive circuit 19 respectively. The timing generator 18 generates various timing signals, outputs the signals to the vertical drive circuit 13, the column circuit 14, the horizontal drive circuit 15, the external output circuit 17, and the shutter drive circuit 19. Therefore, the timing generator performs the driving control with respect to each portion.

The shutter drive circuit 19 is configured so as to select the pixels P by a row unit and adjust an exposure time in the pixels P.

(A-3) Detailed Configuration of Solid-State Imaging Device

The detailed contents of the solid-state imaging device according to the present embodiment are described.

Figure 3:
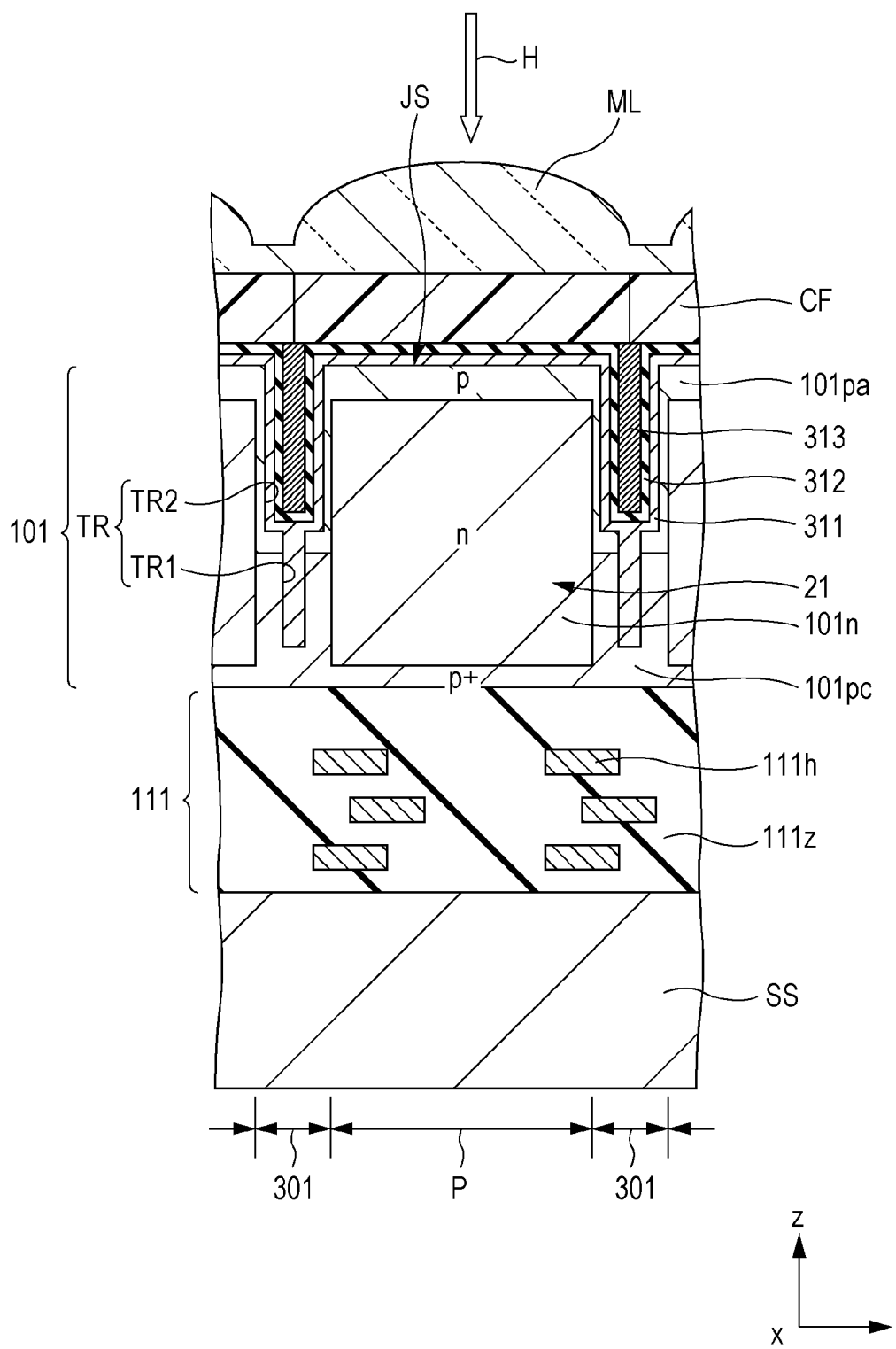
FIG. 3 is a diagram illustrating main portions of the solid-state imaging device in the first embodiment.
Figure 4:
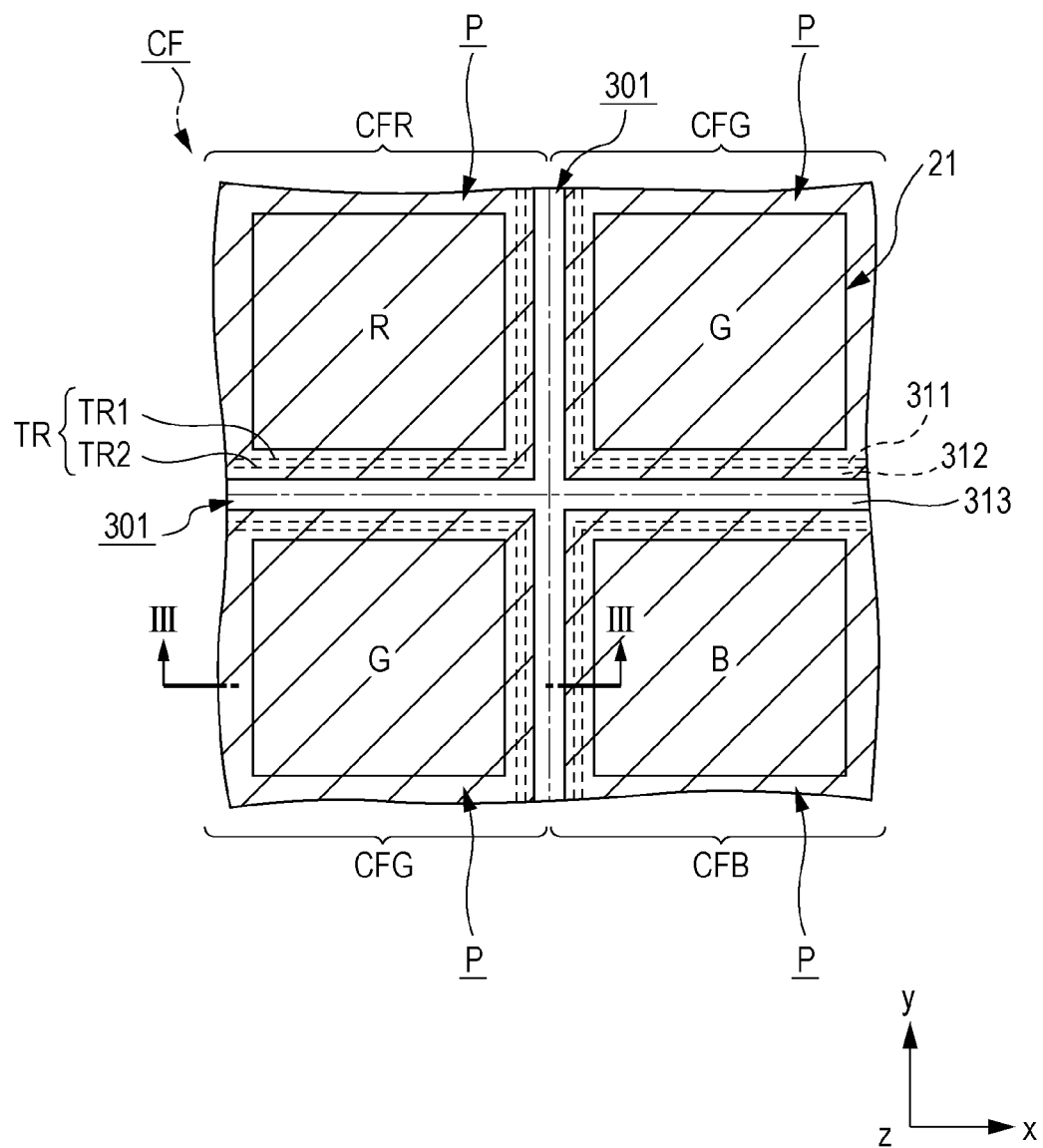
FIG. 4 is a diagram illustrating main portions of the solid-state imaging device in the first embodiment.
Figure 5:
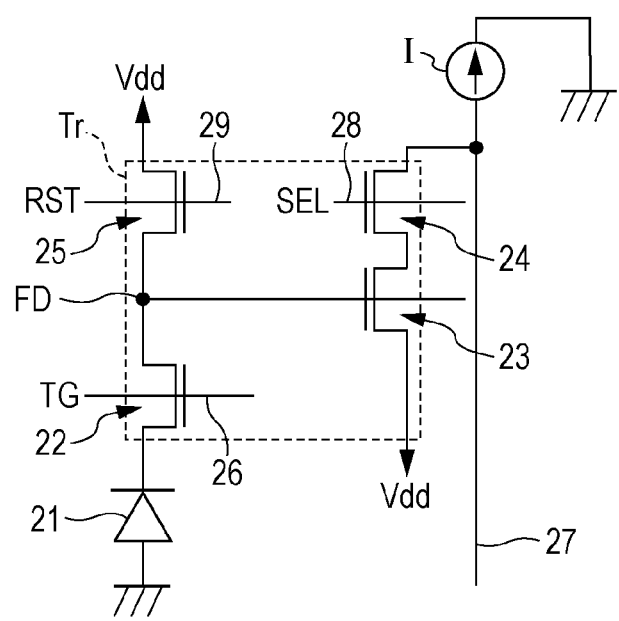
FIG. 5 is a diagram illustrating main portions of the solid-state imaging device in the first embodiment.

FIGS. 3 to 5 are diagrams illustrating main portions of the solid-state imaging device in a first embodiment.

FIG. 3 is a cross-sectional diagram of the pixel P. Moreover, FIG. 4 is a top view of the pixel P. In addition, FIG. 5 illustrates a circuit configuration of the pixel P. Moreover, FIG. 3 illustrates a cross-section taken along a line III-III illustrated in FIG. 4. Moreover, in FIG. 4, for convenience of description, in some cases, portions which illustrate each member are denoted by a broken line or the like other than a solid line.

As illustrated in FIG. 3, the solid-state imaging device 1 includes a photodiode 21 and a pixel separation portion 301 in the inner portion of the semiconductor substrate 101. Here, each portion is provided in the semiconductor substrate 101 of thinned single crystal silicon.

Members such as a color filter CF and a microlens ML are provided on a rear surface (upper surface in FIG. 3) of the semiconductor substrate 101.

In contrast, although not illustrated in FIG. 3, a pixel transistor Tr illustrated in FIG. 5 is provided on the front surface (lower surface in FIG. 3) of the semiconductor substrate 101. Moreover, as illustrated in FIG. 3, a wiring layer 111 is provided so as to cover the pixel transistor Tr. In addition, in the wiring layer 111, a supporting substrate SS is provided on the surface of the side opposite to the side of the semiconductor substrate 101.

That is, the solid-state imaging device 1 of the present embodiment is a "rear surface illumination type CMOS image sensor", and is configured so that the photodiode 21 receives the light H incident from the rear surface (upper surface) and generates a color image by imaging.

Details of each portion will be sequentially described.

(a) Photodiode 21

In the solid-state imaging device 1, a plurality of photodiodes 21 are disposed in the pixel region PA so as to correspond to the plurality of pixels P illustrated in FIG. 2. That is, the plurality of photodiodes 21 are provided so as to be lined up in each of a horizontal direction x and a vertical direction y perpendicular to the horizontal direction x in an imaging surface (xy plan).

The photodiode 21 is configured so as to generate signal charge by receiving the incident light H and performing a photoelectric conversion of the received light and accumulate the generated signal charge.

Here, as illustrated in FIG. 3, the photodiode 21 receives the light H incident from the rear surface (upper surface in FIG. 3) side of the semiconductor substrate 101. As illustrated in FIG. 3, a planarized film HT, a color filter CF and a microlens ML are provided above the photodiode 21, the incident light H, which enters sequentially via each portion, is received through a light sensing surface JS, and a photoelectric conversion of the received light is performed.

As illustrated in FIG. 3, the photodiode 21 is provided in the semiconductor substrate 101.

For example, the photodiode 21 is formed as a charge accumulation region in which an n-type semiconductor region 101n accumulates a charge (electrons). In the photodiode 21, the n-type semiconductor region 101n is provided in the inner portion of p-type semiconductor regions 101pa and 101pc of the semiconductor substrate 101. Here, in the n-type semiconductor region 101n, the p-type semiconductor region 101pc, which has a higher impurity concentration than the rear surface (upper surface) side, is provided in the front surface (lower surface) side of the semiconductor substrate 101. That is, the photodiode 21 is an HAD structure, and the p-type semiconductor regions 101pa and 101pc are formed in each interface of the upper surface side and the lower surface side of the n-type semiconductor region 101n in order to suppress occurrence of a dark current.

As illustrated in FIG. 3, a pixel separation portion 301 which electrically separates the plurality of pixels P is provided in the inner portion of the semiconductor substrate 101, and the photodiode 21 is provided in the region of the pixel P which is divided by the pixel separation portion 301. For example, as illustrated in FIG. 4, the pixel separation portion 301 is formed in a lattice shape so as to be interposed between the plurality of pixels P, and the photodiode 21 is formed in the region of the pixel P which is divided by the pixel separation portion 101*pb*.

In addition, as illustrated in FIG. 5, an anode is grounded to each photodiode 21, and each photodiode 21 is configured so that the accumulated signal charge (here, electrons) is read by a pixel transistor Tr and output to a vertical signal line 27 as an electric signal.

(b) Color Filter CF

In the solid-state imaging device 1, as illustrated in FIG. 3, the color filter CF is provided on the rear surface (upper surface in FIG. 3) side of the semiconductor substrate 101.

As illustrated in FIG. 4, the color filter CF includes a red filter layer CFR, a green filter layer CFG, and a blue filter layer CFB. Each of the red filter layer CFR, the green filter layer CFG, and the blue filter layer CFB is disposed so as to be adjacent to one another, and the layers are all provided so as to correspond to each of the plurality of pixels P.

Here, as illustrated in FIG. 4, each of the red filter layer CFR, the green filter layer CFG, and the blue filter layer CFB is disposed so as to be lined up by Bayer array. That is, a plurality of green filter layers CFG are disposed so as to be lined up in the diagonal direction to be a checked pattern. Moreover, the red filter layer CFR and the blue filter layer CFB are disposed so as to be lined up in the diagonal direction in the plurality of green filter layers CFG.

In the color filter CF, the red filter layer CFR has a higher light transmissivity at a wavelength band (for example, 625 to 740 nm) corresponding to red. That is, the red filter layer CFR is formed so that the incident light H is colored red and transmitted to the light sensing surface JS.

Moreover, in the color filter CF, the green filter layer CFG has a higher light transmissivity at a wavelength band (for example, 500 to 565 nm) corresponding to green. That is, the green filter layer CFG is formed so as to have a higher light transmissivity with respect to the light of the wavelength range of the shorter wavelength than the wavelength having the higher light transmissivity in the red filter layer CFR, and to color the incident light H green and transmit the colored light to the light sensing surface JS.

In addition, in the color filter CF, the blue filter layer CFB has a higher light transmissivity in a wavelength band (for example, 450 to 485 nm) corresponding to blue. That is, the blue filter layer CFG is formed so as to have a higher light transmissivity with respect to the light of the wavelength range of the shorter wavelength than the wavelength having the higher light transmissivity in the green filter layer CFG, and to color the incident light blue and transmit the colored light to the light sensing surface JS.

In this way, in the color filter CF, a plurality of kinds of filter layers CFR, CFG, and CFB having a higher transmissivity in light of wavelength ranges different from one another are disposed so as to be adjacent to one another corresponding to each of the plurality of pixels P.

(c) Microlens ML

In the solid-state imaging device 1, as illustrated in FIG. 3, the microlens ML is provided on the upper surface of the color filter CF in the rear surface (upper surface in FIG. 3) side of the semiconductor substrate 101.

A plurality of microlenses ML are disposed so as to correspond to each pixel P. The microlens ML is a convex lens which is protruded in a convex shape in the rear surface side of the semiconductor substrate 101, and is configured so as to focus the incident light H to the photodiode 21 of each pixel P. For example, the microlens ML is formed by using an organic material such as a resin.

(d) Pixel Separation Portion 301

In the solid-state imaging device 1, as illustrated in FIGS. 3 and 4, the pixel separation portion 301 is formed so as to divide between the plurality of pixels P in the inner portion of the semiconductor substrate 101. In addition, the pixel separation portion 301 electrically separates the plurality of pixels P. That is, the pixel separation portion electrically separates the photodiodes 21 of each pixel P.

As illustrated in FIG. 3, in the pixel separation portion 301 positioned between the plurality of pixels P, the p-type semiconductor regions 101*pa* and 101*pc* are provided between the n-type semiconductor regions 101*n* which configure the charge accumulation region of the photodiode 21.

Moreover, as illustrated in FIG. 3, a trench TR is provided at a portion which is positioned in the side portion of the photodiode 21 in the side of the rear surface (upper surface) into which the incident light H enters in the semiconductor substrate 101.

Specifically, as illustrated in FIG. 3, the trench TR is formed so as to include a first trench TR1 and a second trench TR2.

Here, the first trench TR1 is provided in the deeper portion in the semiconductor substrate 101.

In addition, the second trench TR2 is disposed in the portion shallower than the first trench TR1 in the semiconductor substrate 101. That is, the side surfaces of the second trench TR2 is formed so as to be perpendicularly extended below from the rear surface (upper surface) of the semiconductor substrate 101, and the side surfaces of the first trench TR1 is formed so as to be perpendicularly extended below from a center portion of a bottom surface of the second trench TR2. In addition, the width of the second trench TR2 is formed so as to be wider than that of the first trench TR1.

In addition, the trenches TR are formed so as to be symmetrical in a direction (a y direction (similar to an x direction)) along the rear surface (upper surface) of the semiconductor substrate 101 between the plurality of pixels P.

Moreover, as illustrated in FIG. 3, the pixel separation portion 301 includes a pinning layer 311, an insulating film 312, and a light shielding layer 313, and each of the portions is provided in the inner portion of the trench TR.

As illustrated in FIG. 4, the planar shape of the pixel separation portion 301 is a lattice shape and interposed between the plurality of pixels P. In addition, the trench TR is formed in a lattice shape in the pixel separation portion 301. Here, each of the first trench TR1 and the second trench TR2 is formed in a lattice shape. Moreover, the pinning layer 311, the insulating film 312, and the light shielding layer 313 are provided in the inner portion of the trench TR. In addition, the photodiode 21 is formed in a rectangular region which is divided by the lattice shaped pixel separation portion 101*pb*.

Each portion which configures the pixel separation portion 301 will be described in detail.

(d-1) Pinning Layer 311

As illustrated in FIG. 3, the pinning layer 311 is provided in the inner portion of the first trench TR1 in the deeper portion of the semiconductor substrate 101. Here, the pinning layer 311 is formed so as to bury the entire inner portion of the first trench TR1.

Moreover, the pinning layer 311 is formed so as to cover the surface of the inside of the second trench TR2 which is formed on the first trench TR1 in the shallower portion of the semiconductor substrate 101. Here, the inner side surface of the pinning layer 311 is covered by the insulating film 312 in the inner side portion of the second trench TR2. In addition, the inner side portion of the pinning layer 311, which is covered by the insulating film 312, is embedded by the light shielding layer 313.

Moreover, the pinning layer 311 is formed so as to cover the light sensing surface JS into which the incident light H enters on the rear surface (upper surface) of the semiconductor substrate 101 in addition to the pixel separation portion 301.

Particularly, the pinning layer 311 is formed by using a high dielectric constant material having a negative fixed charge so that a positive charge (hole) accumulation region is formed and occurrence of a dark current is suppressed in an interface portion between the pinning layer and the semiconductor substrate 101. Due to the fact that the pinning layer 311 is formed so as to have the negative fixed charge, since an electric field is added to the interface between the pinning layer and the semiconductor substrate 101 by the negative fixed charge, the positive charge (hole) accumulation region is formed.

In this way, the material of the pinning layer 311 has a higher dielectric constant than the material of the insulating film 312, and for example, the pinning layer is formed by hafnium oxide ($HfO_2$). Besides this, the pinning layer 311 may be formed by zirconium dioxide ($ZrO_2$) or tantalum pentoxide ($Ta_2O_5$).

(d-2) Insulating Film 312

As illustrated in FIG. 3, the insulating film 312 is formed so as to cover the inside surface of the second trench TR2 which formed on the first trench TR 1 in the shallower portion of the semiconductor substrate 101.

Moreover, the insulating film 312 is formed so as to cover the light sensing surface JS via the pinning layer 311 in the rear surface (upper surface) of the semiconductor substrate 101 in addition to the pixel separation portion 301 (refer to FIG. 4).

The insulating film 312 is formed by a material having a lower dielectric constant than the pinning layer 311, for example, such as $SiO_2$.

(d-3) Light Shielding Layer 313

As illustrated in FIG. 3, the light shielding layer 313 is formed so as to bury the inner portion of the second trench TR2 via the pinning layer 311 and the insulating film 312 in the shallower portion of the semiconductor substrate 101.

Here, as illustrated in FIG. 4, the planar shape of the light shielding layer 313 is formed so as to be a lattice shape.

The light shielding layer 313 is formed by a light shielding material which shields light. For example, the light shielding layer 313 is formed by using metal materials such as tungsten (W). The light shielding layer 313 may be formed by using aluminum (Al) in addition to the tungsten (W).

(e) Pixel Transistor Tr

In the solid-state imaging device 1, a plurality of pixel transistors Tr are provided so as to correspond to the plurality of pixels P illustrated in FIG. 2.

As illustrated in FIG. 5, the pixel transistor Tr includes a transfer transistor 22, an amplifying transistor 23, a selection transistor 24, and a reset transistor 25, reads the signal charge from the photodiode 21, and outputs the read signal charge as an electric signal.

Although not illustrated in FIG. 3, each of the transistors 22 to 25 which configure the pixel transistor Tr is provided on the front surface on which the wiring layer 111 is provided in the semiconductor substrate 101. For example, each of the transistors 22 to 25 is an N channel MOS transistor, and for example, each gate is formed by using polysilicon. Moreover, each of the transistors 22 to 25 is covered by the wiring layer 111.

In the pixel transistor Tr, as illustrated in FIG. 5, the transfer transistor 22 is configured so as to transfer the signal charge, which is generated by the photodiode 21, to a floating diffusion FD. Specifically, as illustrated in FIG. 5, the transfer transistor 22 is provided between a cathode of the photodiode 21 and the floating diffusion FD. In addition, the gate of the transfer transistor 22 is electrically connected to the transfer line 26. The transfer transistor 22 transfers the signal charge, which is accumulated in the photodiode 21, to the floating diffusion FD based on a transfer signal TG which is sent from the transfer line 26 to the gate.

In the pixel transistor Tr, as illustrated in FIG. 5, the amplifying transistor 23 is configured so as to amplify the electric signal converted from the charge to the voltage in the floating diffusion FD and output the amplified electric signal. Specifically, as illustrated in FIG. 5, the gate of the amplifying transistor 23 is electrically connected to the floating diffusion FD. Moreover, the drain of the amplifying transistor 23 is electrically connected to a power supply line Vdd, and the source of the amplifying transistor is electrically connected to the selection transistor 24. When the selection transistor 24 is selected so as to be turned on, a constant current is supplied to the amplifying transistor 23 from a constant current source I, and the amplifying transistor is operated as a source follower. Therefore, due to the fact that the selection signal is supplied to the selection transistor 24, the electric signal, which is converted from the charge to the voltage in the floating diffusion FD, is amplified in the amplifying transistor 23.

In the pixel transistor Tr, as illustrated in FIG. 5, the selection transistor 24 is configured so as to output the electric signal, which is output by the amplifying transistor 23, to the vertical signal line 27 based on the selection signal. Specifically, as illustrated in FIG. 5, the gate of the selection transistor 24 is connected to an address line 28 to which the selection signal is supplied. Moreover, the selection transistor 24 is turned on when the selection signal is supplied, and as described above, the selection transistor 24 outputs the output signal, which is amplified by the amplifying transistor 23, to the vertical signal line 27.

In the pixel transistor Tr, as illustrated in FIG. 5, the reset transistor 25 is configured so as to reset the gate potential of the amplifying transistor 23. Specifically, as illustrated in FIG. 5, the gate of the reset transistor 25 is electrically connected to a reset line 29 to which the reset signal is supplied. Moreover, the drain of the reset transistor 25 is electrically connected to the power supply line Vdd, and the source of the reset transistor is electrically connected to the floating diffusion FD. In addition, the reset transistor 25 resets the gate potential of the amplifying transistor 23 to a power supply voltage via the floating diffusion FD based on the reset signal which is sent from the reset line 29.

Figure 6:
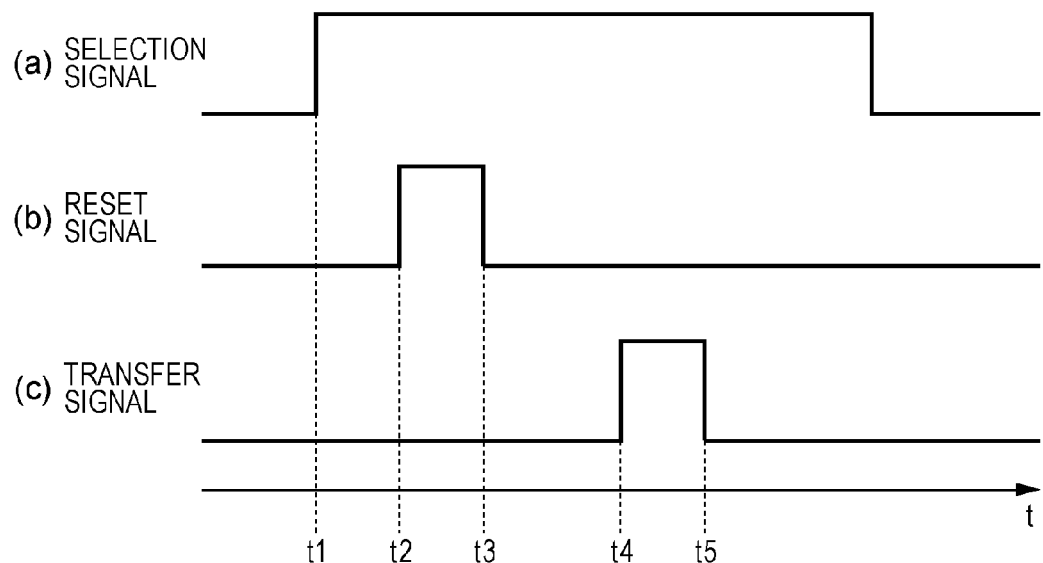
FIG. 6 is a timing chart illustrating a control signal which is sent to a pixel transistor of a pixel when performing an imaging in the first embodiment.

FIG. 6 is a timing chart illustrating a control signal which is sent to the pixel transistor Tr of the pixel P when imaging is performed in the first embodiment.

In FIG. 6, (a) illustrates a selection signal SEL which is input to the gate of the selection transistor 24. Moreover, (b) illustrates a reset signal RST which is input to the gate of the reset transistor 25. In addition, (c) illustrates a transfer signal TG which is input to the gate of the transfer transistor 22 (refer to FIG. 5).

As illustrated in FIG. 6, when the imaging is performed, in a first time point t1, the selection transistor 24 is turned on while the selection signal SEL is set to a high level. Moreover, in a second time point t2, the reset transistor 25 is turned on while the reset signal RST is set to a high level. Thereby, the gate potential of the amplifying transistor 23 is reset (refer to FIG. 5).

In addition, as illustrated in FIG. 6, in a third time point t3, the reset transistor 25 is turned off while the reset signal RST is set to a low level. Moreover, thereafter, the voltage corresponding to the reset level is read to the column circuit 14 as an output signal (refer to FIGS. 2 and 5).

In addition, as illustrated in FIG. 6, in a fourth time point t4, the transfer transistor 22 is turned on while the transfer signal TG is set to a high level. Thereby, the signal charge which is accumulated by the photodiode 21 is transferred to the floating diffusion FD (refer to FIG. 5).

In addition, as illustrated in FIG. 6, in a fifth time point t5, the transfer transistor 22 is turned off while the transfer signal TG is set to a low level. Thereafter, the voltage of the signal level corresponding to the amount of the accumulated signal charge is read to the column circuit 14 as an output signal (refer to FIGS. 2 and 5).

In the column circuit 14, a differential processing between the signal of the previously read reset level and the signal of the latterly read signal level is preformed and the processed signal is accumulated (refer to FIGS. 2 and 5).

Thereby, a fixed pattern noise, which is generated by variations or the like of Vth in each transistor provided for each pixel P, is cancelled out.

Since each gate of the transistors 22, 24, and 25 is connected by a row unit which includes a plurality of pixels P lined up in a horizontal direction x, the operation driving the pixel P as described above is simultaneously performed with respect to the plurality of pixels P which is lined up by the row unit.

Specifically, the pixels are sequentially selected in the perpendicular direction by the horizontal line (pixel row) unit through the selection signal which is supplied by the above-described vertical drive circuit 13. In addition, the transistors of each pixel P are controlled by various timing signals which are output from the timing generator 18. Therefore, the signals of each pixel are read to the column circuit 14 for each column of the pixels P through the vertical signal line 27 (refer to FIGS. 2 and 5).

Moreover, the signals accumulated by the column circuit 14 are selected by the horizontal drive circuit 15 and sequentially output to the external output circuit 17 (refer to FIGS. 2 and 5).

In addition, the signal processing portion 44 performs the signal processing while having the signals obtained by the imaging as raw data and generates a digital image (refer to FIG. 1).

(f) Wiring Layer 111

In the solid-state imaging device 1, as illustrated in FIG. 3, the wiring layer 111 is provided on the front surface (lower surface) of the side opposite to the rear surface (upper surface) on which each portion such as the color filter CF, and the microlens ML is provided in the semiconductor substrate 101.

The wiring layer 111 includes wrings 111h and the insulating layer 111z and is configured so that the wirings 111h are electrically connected to each element in the insulating layer 111z. The wiring layer 111 is a so-called multilayer wiring and formed by laminating alternatively interlayer insulating films configuring the insulating layer 111z and wirings 111h a plurality of times. Here, the plurality of wirings 111h are formed to be laminated via the insulating layer 111z so as to function as each wiring of the transfer line 26, the address line 28, the vertical signal line 27, the reset line 29, or the like illustrated in FIG. 5.

Moreover, in the wiring layer 111, the supporting substrate SS is provided on the surface of the side opposite to the side on which the semiconductor substrate 101 is positioned. For example, a substrate which includes a silicon semiconductor having a thickness of several hundred μm is provided as the supporting substrate SS.

(B) Manufacturing Method

Main portions of a method for manufacturing the above-described solid-state imaging device 1 will be described.

FIGS. 7 to 13 are diagrams illustrating the method of manufacturing the solid-state imaging device in the first embodiment of the present disclosure.

Similarly to FIG. 3, each of FIGS. 7 to 13 is illustrated in a cross-section.

In the present embodiment, the solid-state imaging device 1 illustrated in FIG. 3 or the like is manufactured sequentially through processes illustrated in each drawing.

The details of each process will be sequentially described.

(a) Formation of Photodiode 21 or the Like

Figure 7:
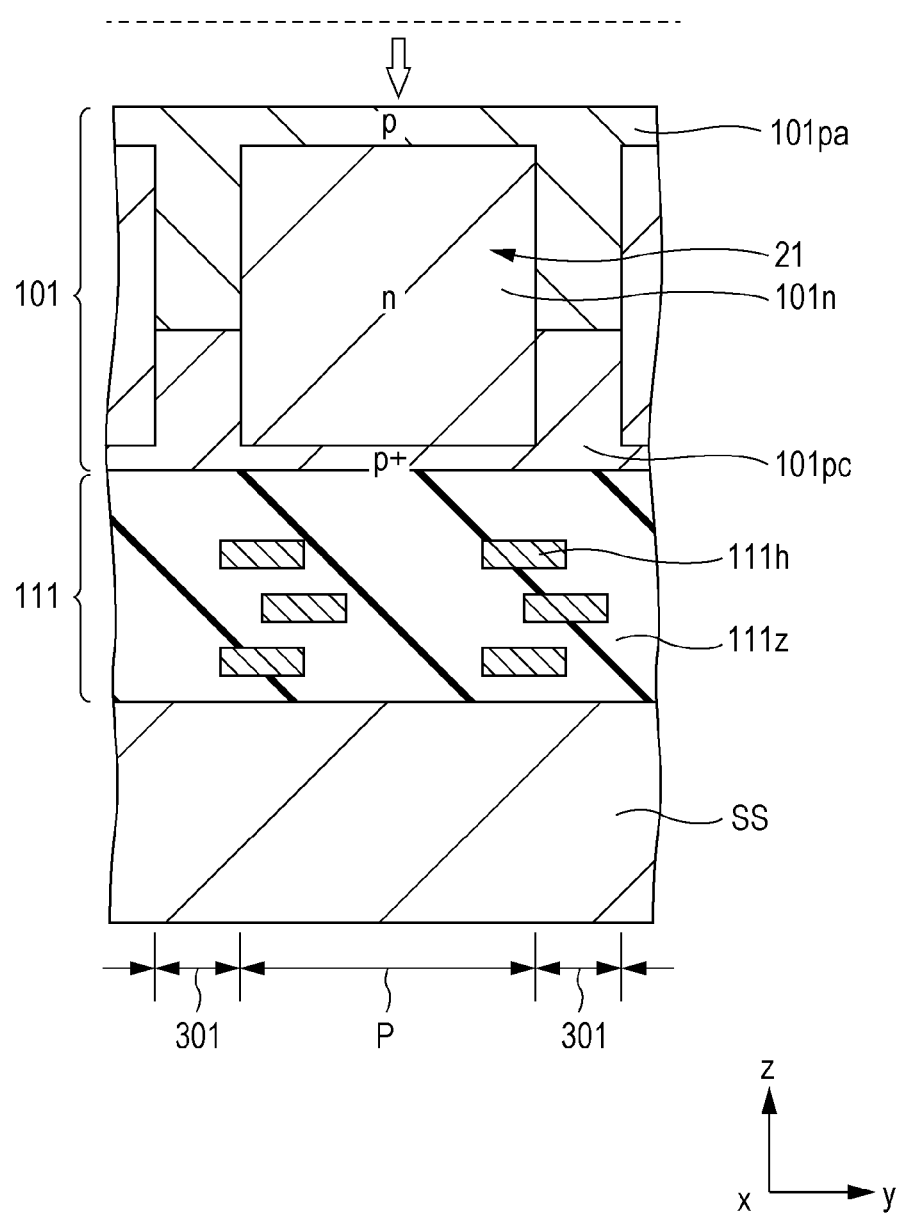
FIG. 7 is a diagram illustrating the method of manufacturing the solid-state imaging device in the first embodiment.

First, as illustrated in FIG. 7, formation of the photodiode 21 or the like is performed.

Here, each portion such as the photodiode 21 or the like is formed by ion-implanting impurities from the front surface of the semiconductor substrate 101 including a single crystal silicon semiconductor. For example, after the p-type semiconductor region 101pa is formed on the entire surface of the semiconductor substrate 101, the p-type semiconductor region 101pc having the higher impurity concentration than the p-type semiconductor region 101pa is formed. Moreover, the n-type semiconductor region 101n is formed on the portion in which the photodiode 21 is formed in the semiconductor substrate 101.

Moreover, after the pixel transistor Tr (not illustrated in FIG. 7) is formed on the front surface of the semiconductor substrate 101, the wiring layer 111 is formed so as to cover the pixel transistor Tr. In addition, the supporting substrate SS is bonded to the front surface of the wiring layer 111.

Thereafter, for example, the semiconductor substrate 101 is thinned. For example, the thinning may be performed according to the following condition.

Thickness of Semiconductor Substrate 101 after Thinning: 2.0 to 10 μm

Method: Chemical Mechanical Polishing (CMP) Method (In addition, Dry Etching or Wet Etching is Possible)

Moreover, members such as the photodiode 21 and the pixel transistor Tr are formed on a semiconductor layer of a SOI substrate (not illustrated), and similarly to the above-described one; after the wiring layer 111 and the supporting substrate SS are provided, the thinning treatment may be performed.

(b) Formation of Second Trench TR2

Figure 8:
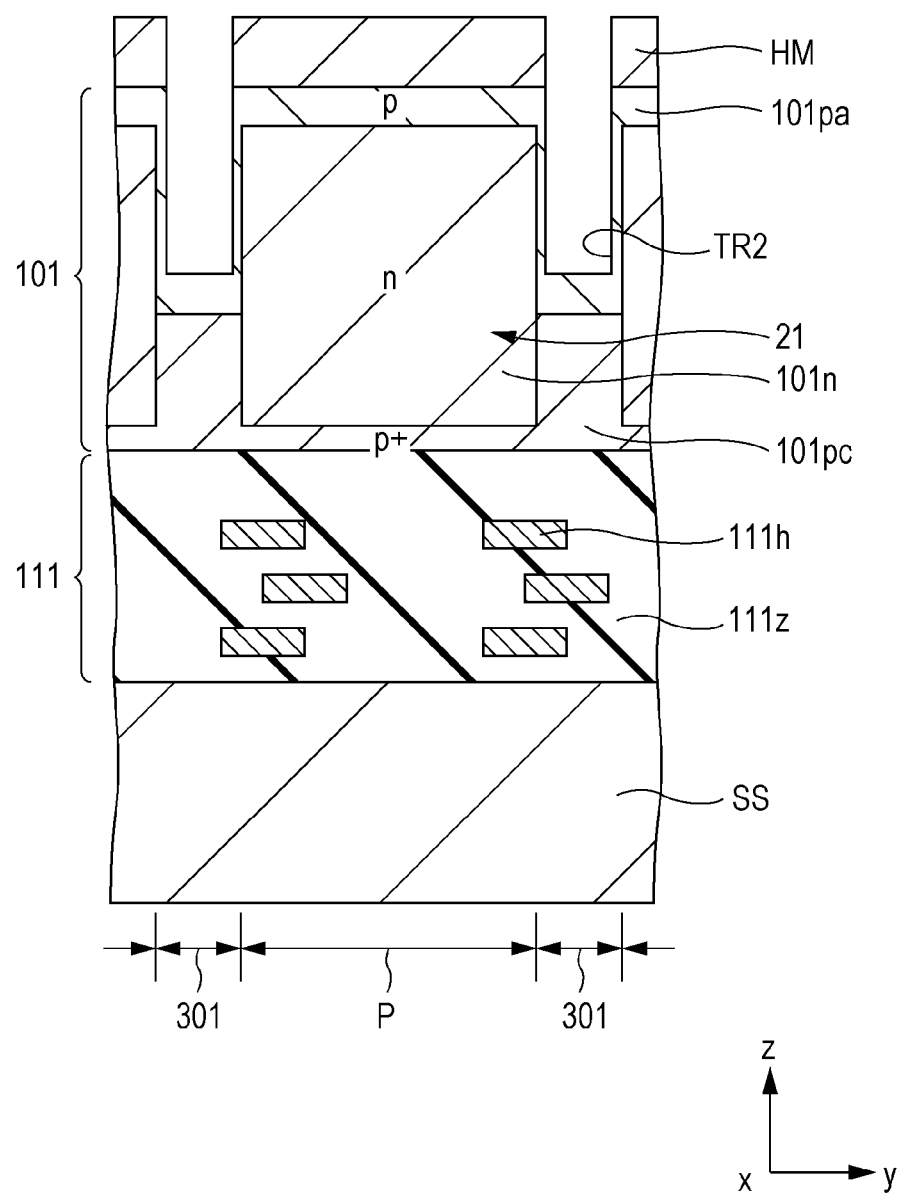
FIG. 8 is a diagram illustrating the method of manufacturing the solid-state imaging device in the first embodiment.

Next, as illustrated in FIG. 8, the second trench TR2 is formed.

Here, the second trench TR2 is formed in the pixel separation portion 301 which is positioned between the plurality of pixels P in the semiconductor substrate 101.

Specifically, as illustrated in FIG. 8, a hard mask HM is formed on the rear surface (upper surface) of the semiconductor substrate 101 by pattern-processing. For example, the hard mask HM is formed by providing a thickness of a $SiO_2$ film such as HDP or P-TEOS so as to be 0.1 to 0.5 μm.

For example, the hard mask HM is pattern-processed by performing the dry etching treatment of the following condition.

Chamber Pressure: 10 to 200 mTorr
Source Power: 500 to 3000 W (60 Hz)
Bias Power: 500 to 2000 W (2 MHz)

CF$_4$ Gas Flow: 10 to 200 sccm

Thereafter, the second trench TR2 is formed by processing the semiconductor substrate 101 using the hard mask HM.

For example, the dry etching is performed to the silicon (Si) semiconductor substrate 101 and the second trench TR2 is formed according to the following condition.

Chamber Pressure: 5 to 100 mTorr
Source Power: 500 to 2000 W
Bias Power: 100 to 1000 W
Cl$_2$ Gas Flow: 10 to 300 sccm
O$_2$ Gas Flow: 1 to 50 sccm For example, from the standpoint of a spectral characteristic, the second trench TR2 may be formed so as to satisfy the following conditions.

Depth: 0.2 to 4 μm (preferably, 1.0 μm or more)
Width: 0.04 to 5 μm (the lower limit is preferable in order to secure a refractive performance)

Moreover, in the present process, the hard mask HM may be formed by a SiN film such as P—SiN in addition to the above-described one.

(c) Formation of First Trench TR1

Figure 9:
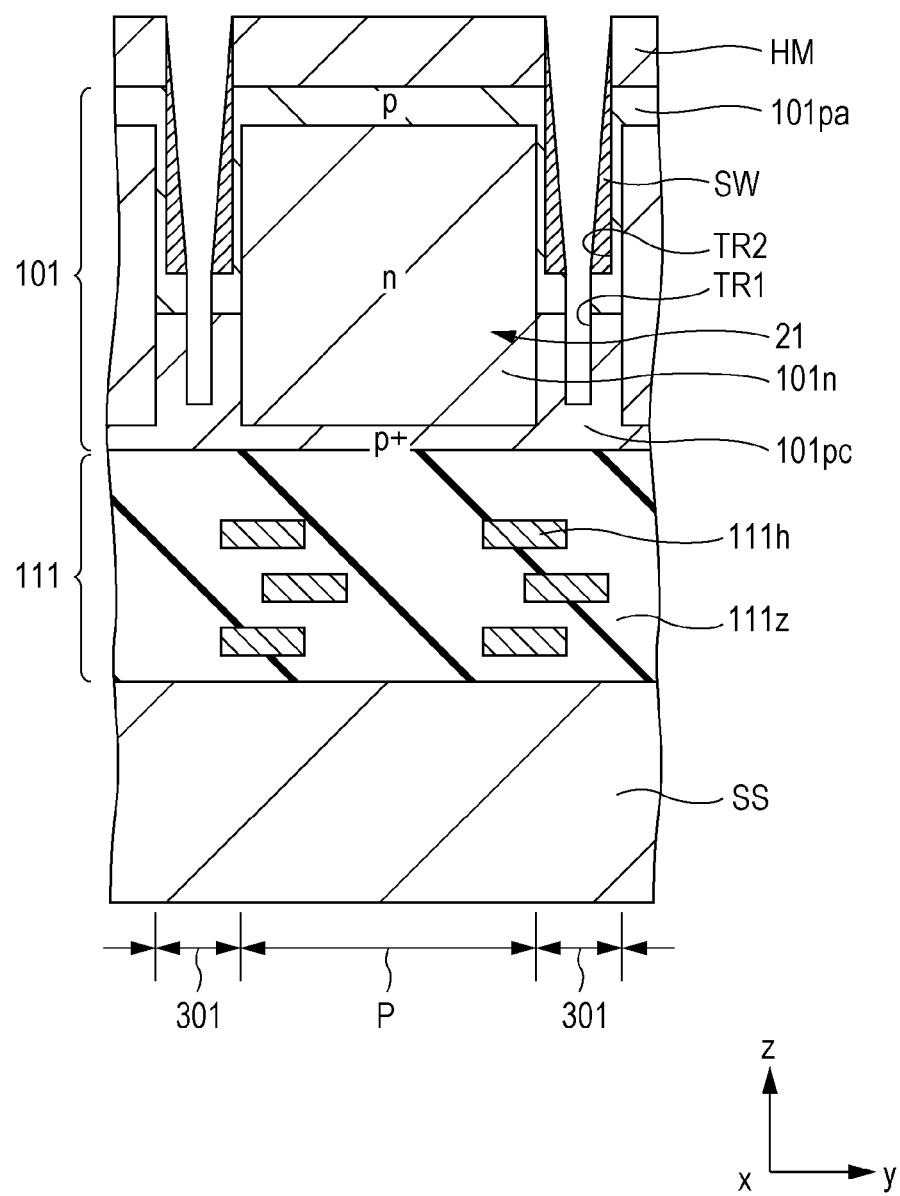
FIG. 9 is a diagram illustrating the method of manufacturing the solid-state imaging device in the first embodiment.

Next, as illustrated in FIG. 9, the first trench TR1 is formed.

Here, in the pixel separation portion 301 of the semiconductor substrate 101, the first trench TR1 is formed on the bottom portion of the second trench TR2.

Specifically, as illustrated in FIG. 9, a side wall SW is formed at the opening portion of the hard mask HM and the inner surface of the second trench TR2. The side surface of the side wall SW is inclined so that the opening of the hard mask HM and the width of the second trench TR2 are narrowed toward the lower portion of the semiconductor substrate 101. For example, the side wall SW is formed by forming different kind of films such as P—SiN and performing of a dry etching with respect to the films.

Moreover, the first trench TR1 is formed by processing the semiconductor substrate 101 using the hard mask HM, on which the side wall SW is provided, as the mask.

For example, in order to perform the dry etching processing of the semiconductor substrate 101, the first trench TR1 may be formed according to the following condition.

Depth: 0.3 to 10 μm (it is preferable that the depth is 1.5 μm or more from the rear surface (upper surface) of the semiconductor substrate 101 and from a blooming characteristic)
Width: 0.02 to 5 μm or more (in order to secure an insulation performance, the lower limit is preferable and 0.05 μm or more is further preferable)

(d) Removal of Hard Mask HM and Side Wall SW

Figure 10:
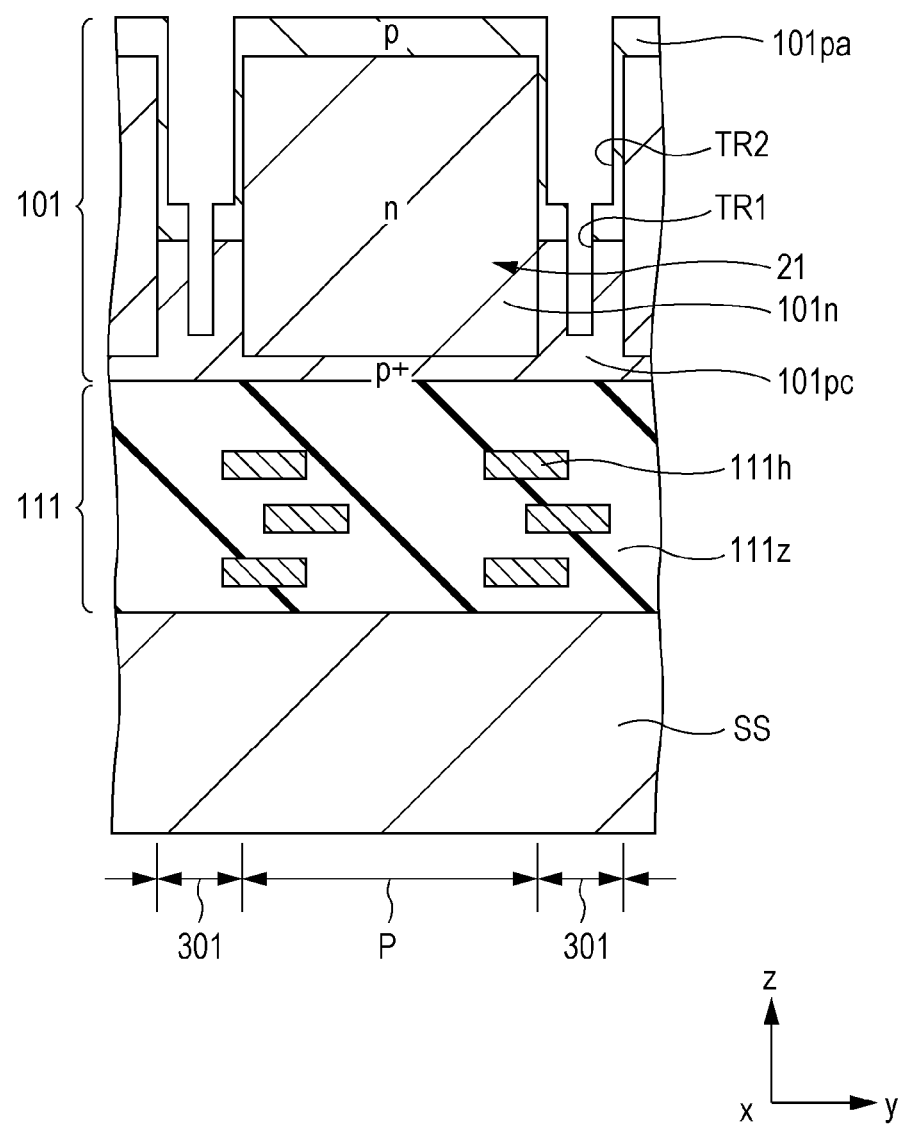
FIG. 10 is a diagram illustrating the method of manufacturing the solid-state imaging device in the first embodiment.

Next, as illustrated in FIG. 10, the hard mask HM and the side wall SW are removed.

Here, for example, the hard mask HM and the side wall SW are removed from the rear surface (upper surface) of the semiconductor substrate 101 by performing an etching processing to the hard mask HM and the side wall SW. Thereby, the rear surface (upper surface) of the semiconductor substrate 101 is exposed.

(e) Formation of Pinning Layer 311

Figure 11:
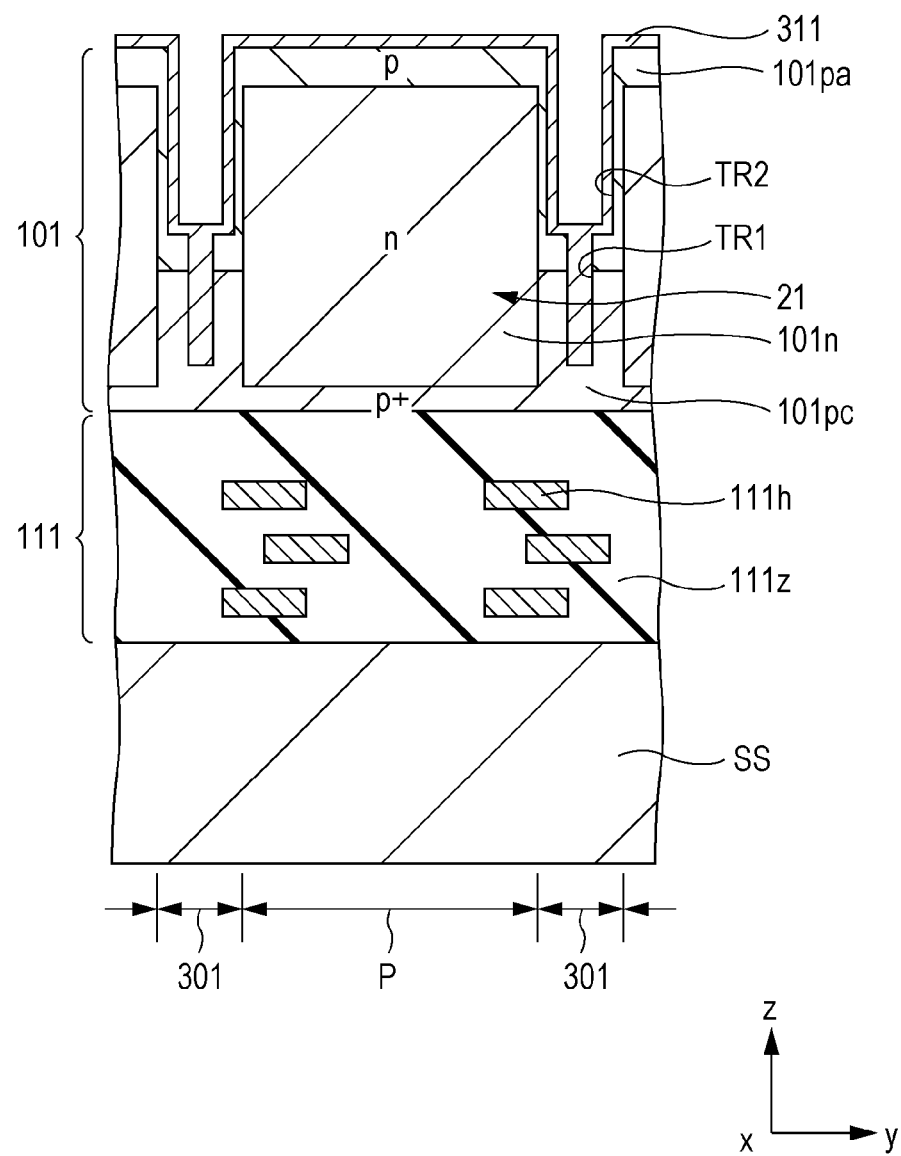
FIG. 11 is a diagram illustrating the method of manufacturing the solid-state imaging device in the first embodiment.

Next, as illustrated in FIG. 11, the pinning layer 311 is formed.

Here, the pinning layer 311 is formed so as to bury the entire inner portion of the first trench TR1 in the deeper portion of the semiconductor substrate 101.

Moreover, the pinning layer 311 is formed so as to cover the inside surface of the second trench TR2, which is formed on the first trench TR1, in the shallower portion of the semiconductor substrate 101.

In addition, the pinning layer 311 is formed so as to cover the light sensing surface JS into which the incident light H enters on the rear surface (upper surface) of the semiconductor substrate 101 in addition to the pixel separation portion 301.

The material of the pinning layer 311 is an insulation material which has a higher dielectric constant than that of the insulating film 312, and uses a high dielectric constant material having a negative fixed charge.

For example, the pinning layer 311 is formed according to the following condition.

Material: HfO$_2$
Formation Method: Chemical Vapor Deposition (CVD) Method
Thicknesses of Inside Surface of Second Trench TR2 and Upper Portion of Semiconductor Substrate 101: 1 to 200 nm For example, the pinning layer 311 may be formed also by using a material such as Al$_2$O$_3$, ZrO$_2$, TiO$_2$, Ta$_2$O$_5$, or MgO$_2$ in addition to HfO$_2$. The materials are proven to be useful in a gate insulating film of an insulating gate-type electric field effect transistor or the like. Therefore, the pinning layer is easily formed since the film forming method is established.

Among the materials, it is more preferable to use the hafnium oxide (HfO$_2$), the tantalum pentoxide (Ta$_2$O$_5$), and the aluminum oxide (Al$_2$O$_3$). Since the material has a high pinning performance (negative fixed charge amount), suppression effects to a white point and a dark current can be preferably obtained. Moreover, the materials are preferable since a high process practicability can be obtained.

Besides this, materials such as lanthanum oxide(La$_2$O$_3$), praseodymium oxide(Pr$_2$O$_3$), cerium oxide(CeO$_2$), neodymium oxide (Nd$_2$O$_3$), promethium oxide (Pm$_2$O$_3$), samarium oxide (Sm$_2$O$_3$), europium oxide(Eu$_2$O$_3$), gadolinium oxide (Gd$_2$O$_3$), terbium oxide(Tb$_2$O$_3$), dysprosium oxide(Dy$_2$O$_3$), holmium oxide(Ho$_2$O$_3$), erbium oxide (Er$_2$O$_3$), thulium oxide(Tm$_2$O$_3$), ytterbium oxide(Yb$_2$O$_3$), lutetium oxide(Lu$_2$O$_3$), yttrium oxide(Y$_2$O$_3$) can be used. Moreover, the pinning layer 311 can be used by using a hafnium nitride film, an aluminum nitride film, a hafnium oxynitride film, or an aluminum oxynitride film.

In addition, the pinning layer 311 may be formed according to various film forming methods such as a sputtering method or Atomic Layer Deposition (ALD) method in addition to the Chemical Vapor Deposition (CVD) method.

For example, when the hafnium oxide (HfO$_2$) film is formed according to an Organic Metal Chemical Vapor Deposition method (MOCVD method), the film formation is performed according to the following manufacturing condition by using the following precursor.

Precursor: TEMA-Hf(Tetrakis ethylmethylamido hafnium), TDMA-Hf(Tetrakis dimethylamido hafnium), or TDEA-Hf(Tetrakis diethylamido hafnium)
Film Formation Substrate Temperature: 200° C. to 600° C.
Flow Rate of Precursor: 10 cm$^3$/min to 500 cm$^3$/min
Illumination Time of Precursor: 1 to 15 seconds
Flow Rate of Ozone (O$_3$): 5 cm$^3$/min to 50 cm$^3$/min In addition, when the hafnium oxide film is formed according to the Atomic Layer Deposition method (ALD method), the film formation is performed according to the following manufacturing condition by using the following precursor.

Precursor: TEMA-Hf(Tetrakis ethylmethylamido hafnium), TDMA-Hf(Tetrakis dimethylamido hafnium), or TDEA-Hf(Tetrakis diethylamido hafnium)

Film Formation Substrate Temperature: 200° C. to 500° C.

Flow Rate of Precursor: 10 cm$^3$/min to 500 cm$^3$/min

Illumination Time of Precursor: 1 to 15 seconds

Flow Rate of Ozone ($O_3$): 5 cm$^3$/min to 50 cm$^3$/min

Since $SiO_2$ layer decreasing the interface potential during the film formation can be simultaneously formed to about 1 nm in the Atomic Layer Deposition method, the ALD method is more preferable.

Besides this, an antireflective film may be formed on the pinning layer 311.

(f) Formation of Insulating Film 312

Figure 12:
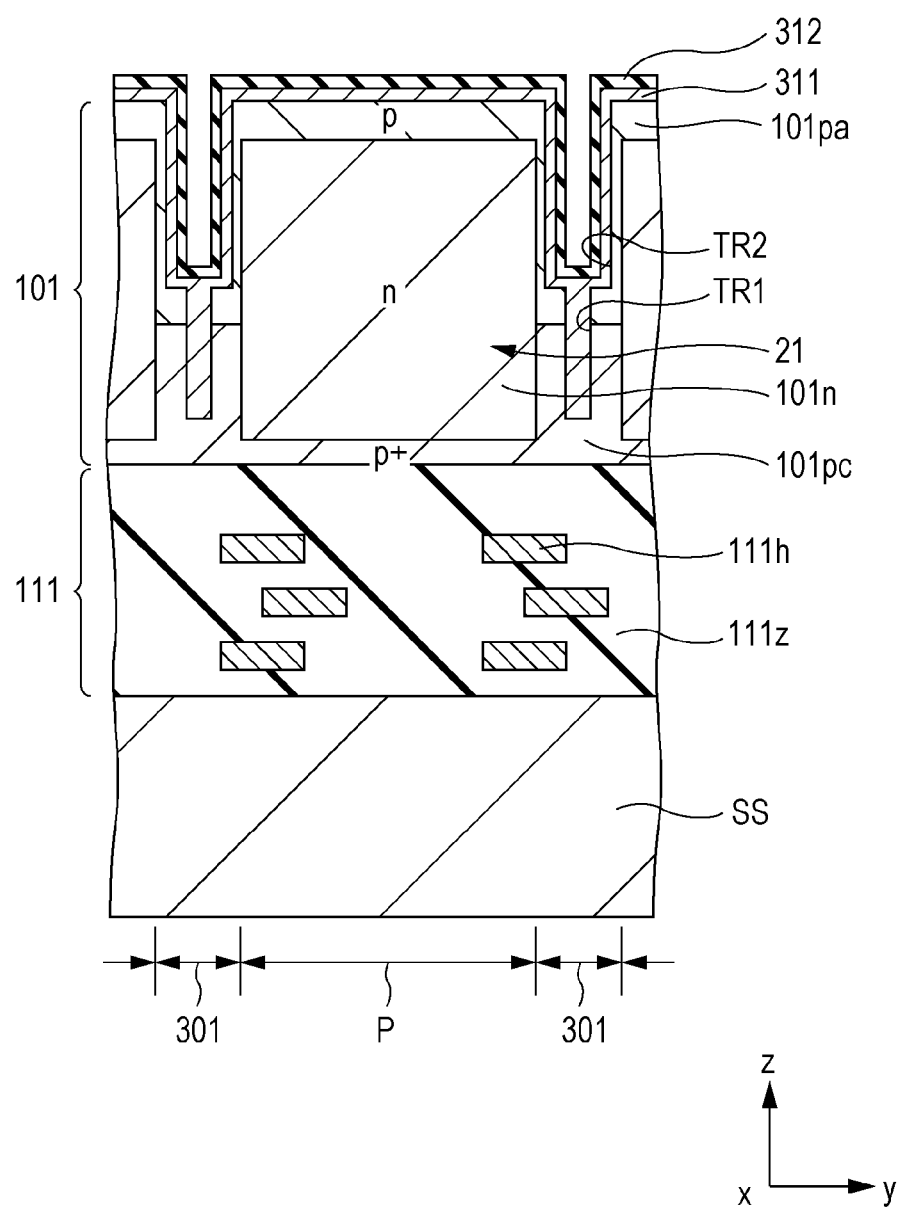
FIG. 12 is a diagram illustrating the method of manufacturing the solid-state imaging device in the first embodiment.

Next, as illustrated in FIG. 12, the insulating film 312 is formed.

Here, the insulating film 312 is formed so as to cover the inside surface of the second trench TR2 which is formed on the first trench TR1 in the shallower portion of the semiconductor substrate 101.

Moreover, the insulating film 312 is formed on the rear surface (upper surface) of the semiconductor substrate 101 in addition to the pixel separation portion 301 so that the insulating film 312 covers the light sensing surface JS via the pinning layer 311.

The insulating film 312 is formed by using a material having a lower dielectric constant than the material of the pinning layer 311.

For example, the insulating film 312 may be formed according to the following condition.

Material: $SiO_2$

Formation Method: CVD method

Thickness: 5 μm or less (in order to secure sensitivity)

(g) Formation of Light Shielding Layer 313

Figure 13:
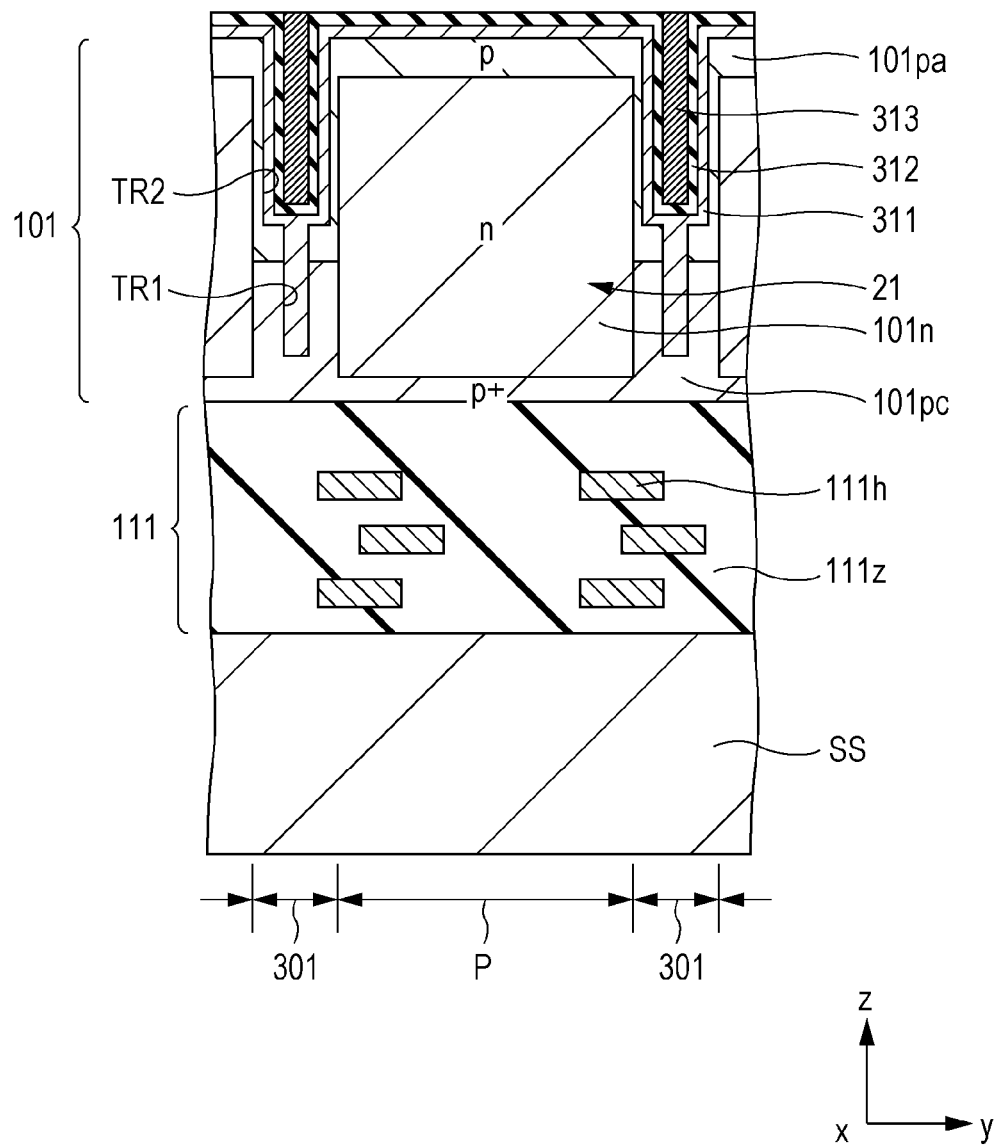
FIG. 13 is a diagram illustrating the method of manufacturing the solid-state imaging device in the first embodiment.

Next, as illustrated in FIG. 13, the light shielding layer 313 is formed.

Here, the light shielding layer 313 is formed so as to bury the inner portion of the second trench TR2 via the pinning layer 311 and the insulating film 312 in the shallower portion of the semiconductor substrate 101.

The light shielding layer 313 is formed by using a light shielding material which shields light.

For example, the light shielding layer 313 may be used according to the following condition.

Material: Tungsten (W)

Formation Method: Sputtering Method

In the present process, the light shielding layer 313 is formed on the rear surface (upper surface) of the semiconductor substrate 101 so as to bury the inner portion of the second trench TR2. Thereafter, in the light shielding layer 313, the portion which is provided on the rear surface (upper surface) of the semiconductor substrate 101 is removed. Thereby, the light shielding layer 313 is not formed on the light sensing surface JS and is embedded to the inner portion of the second trench TR2. Therefore, the pixel separation portion 301 is formed between the plurality of pixels P.

In addition, the light shielding layer 313 may be formed by forming the film of other light shielding materials through other film forming methods such as the CVD method.

The light shielding layer 313 may be formed by using aluminum (Al) in addition to the tungsten (W). When metals (for example, copper) other than aluminum or tungsten are used, a reflective performance may be decreased in a portion of a visual light range. In addition, when a metal having a high diffusion coefficient in silicon other than aluminum or tungsten is used, since the metal may be diffused into the silicon semiconductor substrate 101, occurrence of a dark current may be increased.

(h) Formation of Color Filter CF and Microlens ML

Next, as illustrated in FIG. 3, each member of the color filter CF and the microlens ML is formed.

Here, the color filter CF is formed on the rear surface (upper surface) of the semiconductor substrate 101.

For example, the color filter CF is formed by pattern-processing a coating film through a lithography technology after applying an application liquid including coloring matters such as pigments or dyes and photosensitive resins through a coating method such as the spin-coating method and forming the coating film. Thereby, the color filter CF is provided by forming each of the filter layers CFR, CFG, and CFB.

Thereafter, the microlens ML is provided on the upper surface of the color filter CF.

For example, after a photosensitive resin film is pattern-processed through a photolithography technology, the microlens ML is formed by deforming the pattern-processed resin into a lens shape through a reflow treatment. Beside this, after a resist pattern of a lens shape is formed on a lens material film, the microlens ML may be formed by performing an etch-back processing while having the resist pattern as a mask.

In this way, the "rear surface illumination type" of CMOS image sensor is completed by performing sequentially each process.

(C) Conclusion

As described above, in the present embodiment, the plurality of photodiodes 21 which receive the incident light H through the light sensing surface JS are provided so as to correspond to the plurality of pixels P in the inner portion of the semiconductor substrate 101 respectively. Moreover, the pixel separation portion 301 is provided in the inner portion of the semiconductor substrate 101 between the plurality of pixels P (refer to FIG. 3).

Figure 23:
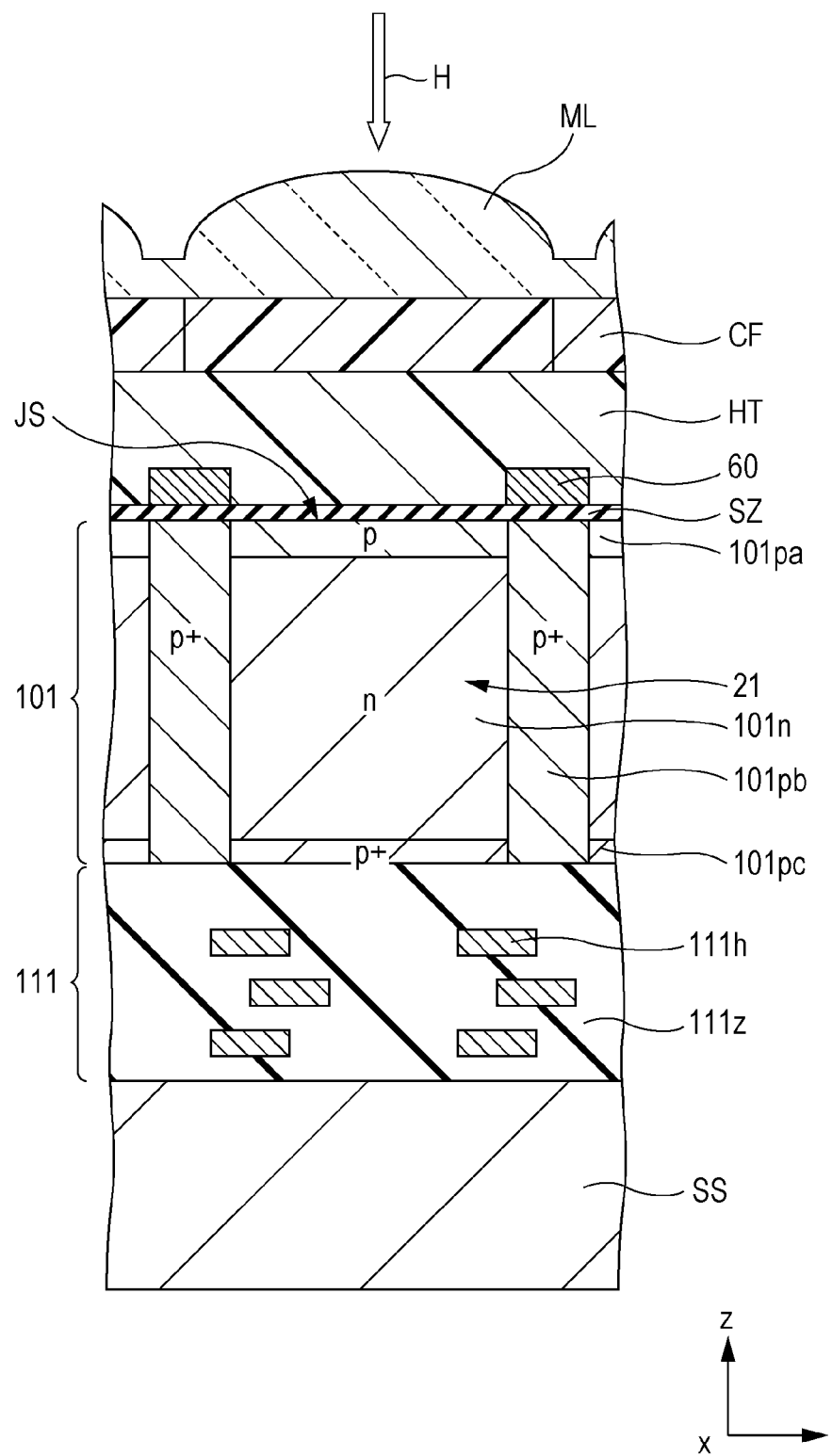
FIG. 23 is a cross-sectional diagram illustrating main portions of a pixel P in a CMOS image sensor of "a rear surface illumination type".

As described above, unlike the present embodiment, when the pixel separation portion 101pb is formed by ion-implanting an impurity having a high concentration from the front surface (lower surface) side of the semiconductor substrate 101 (refer to FIG. 23), the image quality may be decreased because of occurrence of the optical noise due to leakage of the inclined light. For example, a "color mixing" is generated, and color reproducibility in the captured color image may be decreased. In addition, quality of the captured image may be decreased due to occurrence of "shading".

Besides this, when the pixel separation portion 101pb (refer to FIG. 23) is formed by ion-implanting an impurity having a high concentration, the width of the pixel separation portion 101pb is widened with consideration for diffusion of the impurity or the like. Particularly, in the case of the "rear surface illumination type", the width of the pixel separation portion 101pb is widened in the rear surface (upper surface) side of the semiconductor substrate 101. Thereby, it may be difficult to widen the occupancy area of the photodiode 21. Therefore, a saturation charge accumulation amount (Qs) of the photodiode 21 is decreased, and it may be difficult to improve the quality of the captured image.

Moreover, since light having a shorter wavelength is absorbed in the vicinity of the rear surface (upper surface) into which the light enters in the semiconductor substrate 101 which is formed of a single crystal silicon semiconductor, particularly, the "color mixing" may be significantly generated between pixels which receive the light having the shorter wavelength such as blue.

However, in the present embodiment, the pinning layer 311, the insulating layer 312, and the light shielding layer 313 are embedded into the trench TR which is provided at the side portion of the photodiode 21 in the rear surface (incident surface) side into which the incident light H enters in the semiconductor substrate 101 (refer to FIG. 3). Thereby, the pixel separation portion 301 shields light and optically separates the plurality of pixels P, and insulates and electrically separates the plurality of pixels P. Therefore, since both functions of the light shielding between pixels and the element separation are realized in the pixel separation portion 301, it is possible to improve a spectral characteristic and a blooming characteristic in the present embodiment.

Moreover, since the pixel separation portion 301 is not formed by ion-implanting an impurity having a high concentration in the present embodiment, the saturation charge accumulation amount (Qs) is not decreased, and it is possible to easily improve quality of the captured image.

Besides this, in the present embodiment, the trench TR of a multistage structure including the first trench TR1 and the second trench TR2 is provided in the pixel separation portion 301. Here, the width of the second trench TR2 is formed so as to be wider than the width of the first trench TR1 in the portion shallower than the first trench TR 1 in the semiconductor substrate 101.

Moreover, in the present embodiment, the pinning layer 311 is formed so as to bury the inner portion of the first trench TR1 and cover the inside surface of the second trench TR2. In addition, the insulating film 312 is formed so as to cover the inside surface of the second trench TR2 via the pinning layer 311. Moreover, the light shielding layer 313 is formed so as to bury the inner portion of the second trench TR2 via the pining layer 311 and the insulating film 312.

In this way, in the present embodiment, since the pixel separation portion 301 includes the pinning layer 311, occurrence of a dark current is suppressed, and occurrence of a white point in the captured image can be prevented. Moreover, since the pinning layer 311 includes the negative fixed charge, carriers (electrons or holes) generated when forming the trench in the rear surface can be held to the fixed charges.

Moreover, in the trench TR of the multistage structure of the present embodiment, the metal material is not embedded to the first trench TR1 of the deeper position, the metal material is embedded to the inner portion of the second trench TR2 which is provided on the shallow position of the uppermost stage, and the light shielding layer 313 is formed. Thereby, the light shielding layer 313 can be formed by uniformly burying the metal material to the second trench TR2 without voids. Therefore, since the light shielding layer 313 can effectively shield light between the plurality of pixels P, occurrence of the "color mixing" and occurrence of the "shading" can be prevented. That is, when the metal material is embedded into the deeper trench (for example, the depth is 0.5 µm or more) as the light shielding material, voids are generated and it is difficult to uniformly bury the metal material. Therefore, it is difficult to prevent the "color mixing" and the "shading" from being generated. However, the disadvantageous can be solved according to the present embodiment.

Therefore, it is possible to improve quality of the captured image in the present embodiment.

2. Second Embodiment (A) Manufacturing Method

Figure 14:
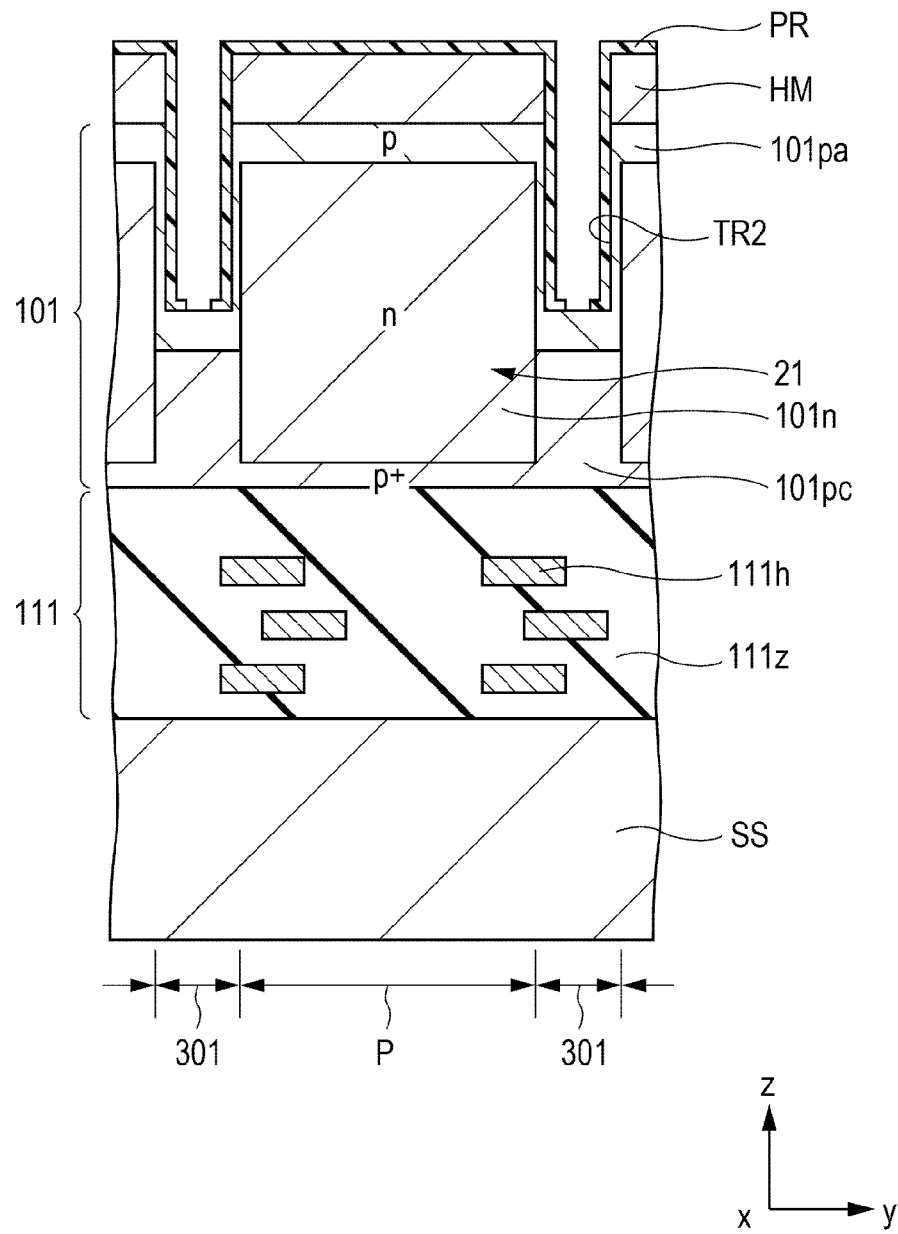
FIG. 14 is a diagram illustrating the method of manufacturing a solid-state imaging device in a second embodiment.
Figure 15:
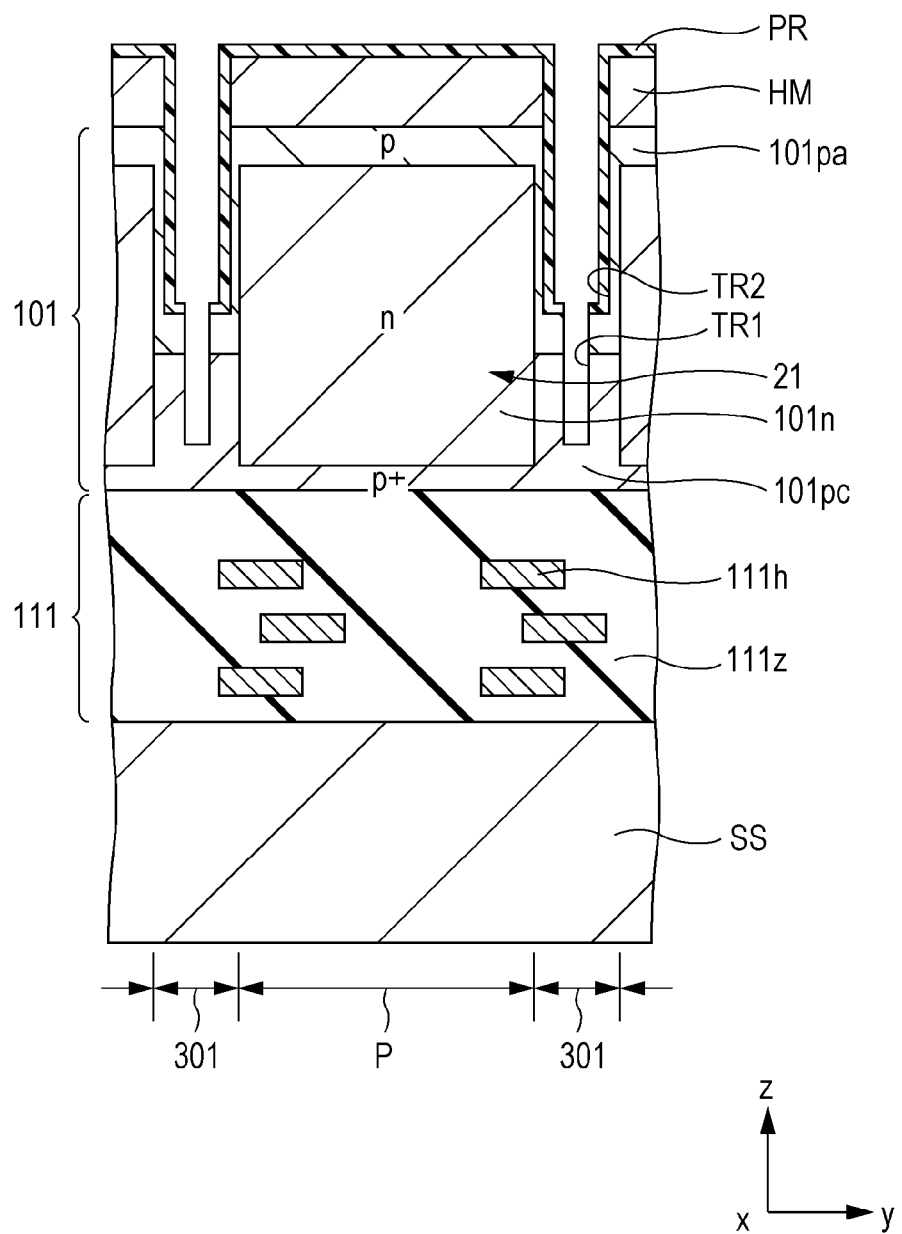
FIG. 15 is a diagram illustrating the method of manufacturing the solid-state imaging device in the second embodiment.

FIGS. 14 and 15 are diagrams illustrating the method of manufacturing a solid-state imaging device in a second embodiment.

Similarly to FIG. 3, each of FIGS. 14 and 15 is illustrated in a cross-section.

In the manufacturing of the solid-state imaging device of the present embodiment, similarly to the case of the first embodiment, the formation of the photodiode 21 or the like (refer to FIG. 7) and the formation of the second trench TR2 (refer to FIG. 8) are performed. Thereafter, the first trench TR1 is formed sequentially through processes illustrated in FIGS. 14 and 15. In addition, similarly to the case of the first embodiment, the formation of the pinning layer 311 (refer to FIG. 11), the formation of the insulating film 312 (refer to FIG. 12), the formation of the light shielding layer 313 (refer to FIG. 13), the formation of the color filter CF, and the formation of the microlens ML (refer to FIG. 3) are performed.

As illustrated in FIGS. 14 and 15, in the present embodiment, the process for forming the first trench TR1 is different from that of the first embodiment. Except for this point and those related to the point, the present embodiment is similar to the first embodiment. Thereby, description is appropriately omitted with respect to the overlapped portions.

The detail of each process will be sequentially described like the following.

(a) Formation of Photoresist Pattern PR

After the second trench TR2 is formed (refer to FIG. 8), the photoresist pattern PR is formed as illustrated in FIG. 14.

Here, after a photoresist film (not illustrated) is formed on the rear surface (upper surface) of the semiconductor substrate 101 on which the hard mask HM is formed, the photoresist pattern PR is formed by pattern-processing the photoresist film (not illustrated) through a lithography technology.

Specifically, in the rear surface (upper surface) side of the semiconductor substrate 101, the pattern shape of the photoresist pattern PR is formed so that the portion on which the first trench TR1 is formed is opened and other portions are covered. That is, the photoresist pattern PR is formed so as to be the state where the portion, in which the first trench TR1 is formed on the bottom surface of the second trench TR2, is exposed and the other inner surfaces of the second trench TR2 are covered.

(b) Formation of First Trench TR1

Next, as illustrated in FIG. 15, the first trench TR1 is formed.

Here, similarly to the case of the first embodiment, the first trench TR1 is formed on the bottom portion of the second trench TR2 in the pixel separation portion 301 of the semiconductor substrate 101.

Moreover, the rear surface is exposed by removing the photoresist pattern PR and the hard mask HM from the rear surface (upper surface) side of the semiconductor substrate 101.

Thereafter, similarly to the case of the first embodiment, the "rear surface illumination type" CMOS image sensor is completed through each process.

(B) Conclusion

As described above, the solid-state image device having the same configuration as that of the case of the first embodiment can be formed in the present embodiment.

Therefore, the same effects as those of the case of the first embodiment can be preferably achieved in the present embodiment.

3. Third Embodiment (A) Device Configuration

Figure 16:
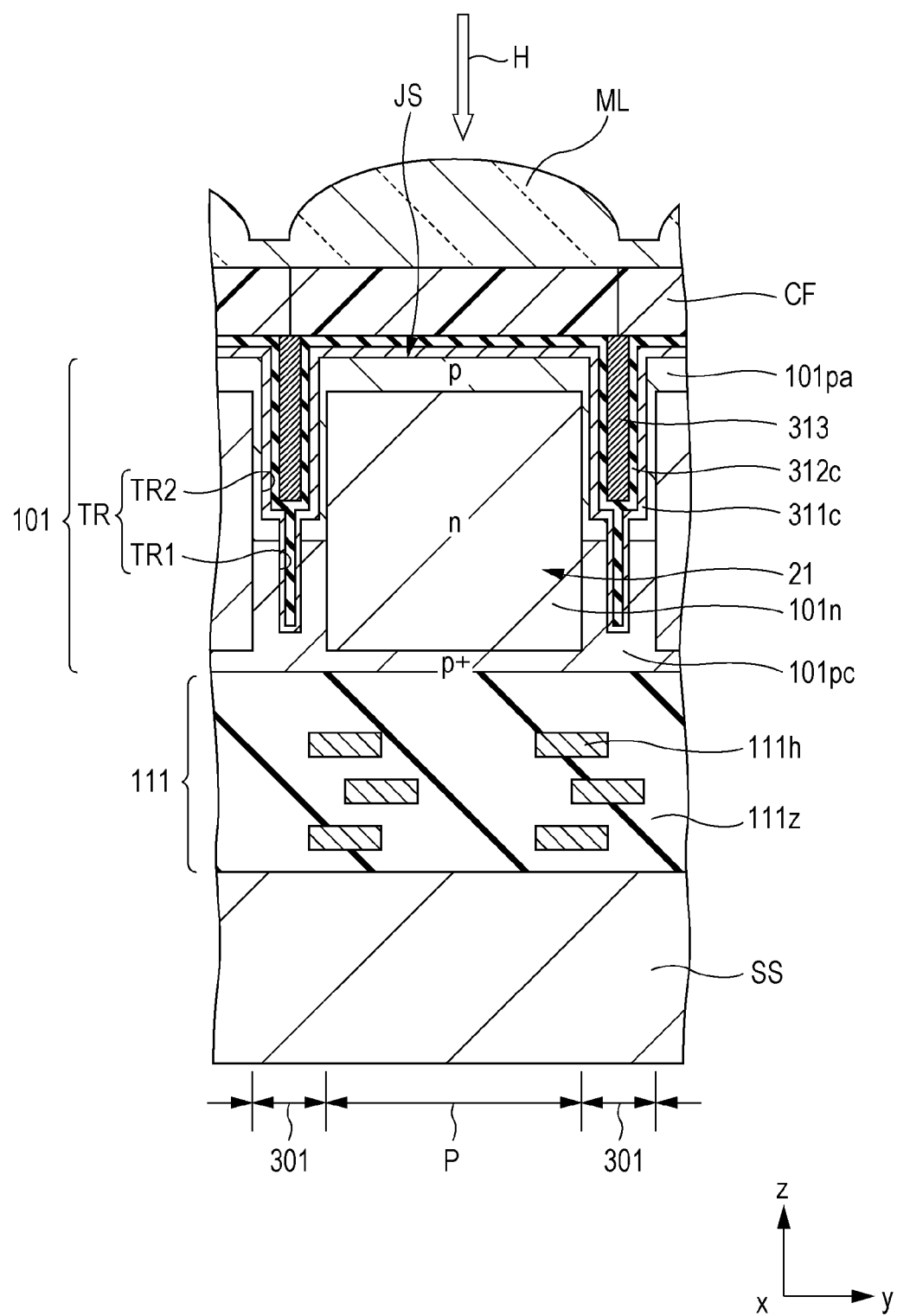
FIG. 16 is a diagram illustrating main portions of a solid-state imaging device in a third embodiment.

FIG. 16 is a diagram illustrating main portions of a solid-state imaging device in a third embodiment.

FIG. 16 illustrates the cross-section of the pixel P similarly to FIG. 3.

As illustrated in FIG. 16, in the present embodiment, the pinning layer 311c and the insulating film 312c are different from the first embodiment. Except for this point and those related to the point, the present embodiment is similar to the first embodiment. Thereby, description is appropriately omitted with respect to the overlapped portions.

(a) Pinning Layer 311c

As illustrated in FIG. 16, similarly to the case of the first embodiment, the pinning layer 311c is formed so as to cover the inside surface of the second trench TR2 which is formed on the first trench TR1 in the shallower portion of the semiconductor substrate 101.

However, as illustrated in FIG. 16, unlike the case of the first embodiment, the pinning layer 311c is not formed so as to bury the entire inner portion of the first trench TR1 in the deeper portion of the semiconductor substrate 101.

Here, the pinning layer 311c is formed so as to cover the inside surface of the first trench TR1.

(b) Insulating Film 312c

As illustrated in FIG. 16, similarly to the case of the first embodiment, the insulating film 312c is formed so as to cover the inside surface of the second trench TR2, which is formed on the first trench TR1 in the shallower portion of the semiconductor substrate 101, via the pinning layer 311c.

However, as illustrated in FIG. 16, unlike the case of the first embodiment, the insulating film 312c is also formed at the inner portion of the first trench TR1 in the deeper portion of the semiconductor substrate 101.

Here, the insulating film 312c is formed so as bury the inner portion of the first trench TR1 via the pinning layer 311c.

(B) Manufacturing Method

The main portions of the method for manufacturing the solid-state imaging device will be described.

Figure 17:
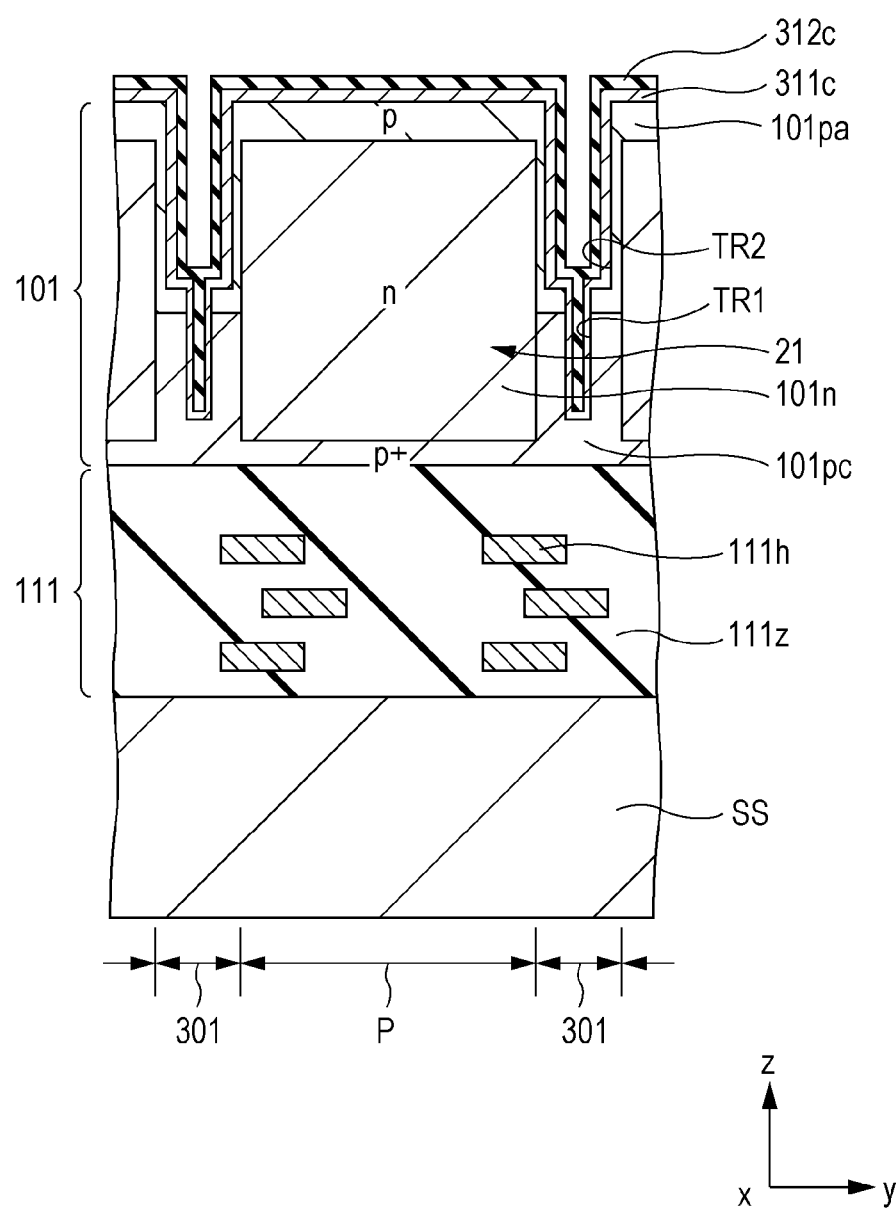
FIG. 17 is a diagram illustrating the method of manufacturing the solid-state imaging device in the third embodiment.
Figure 18:
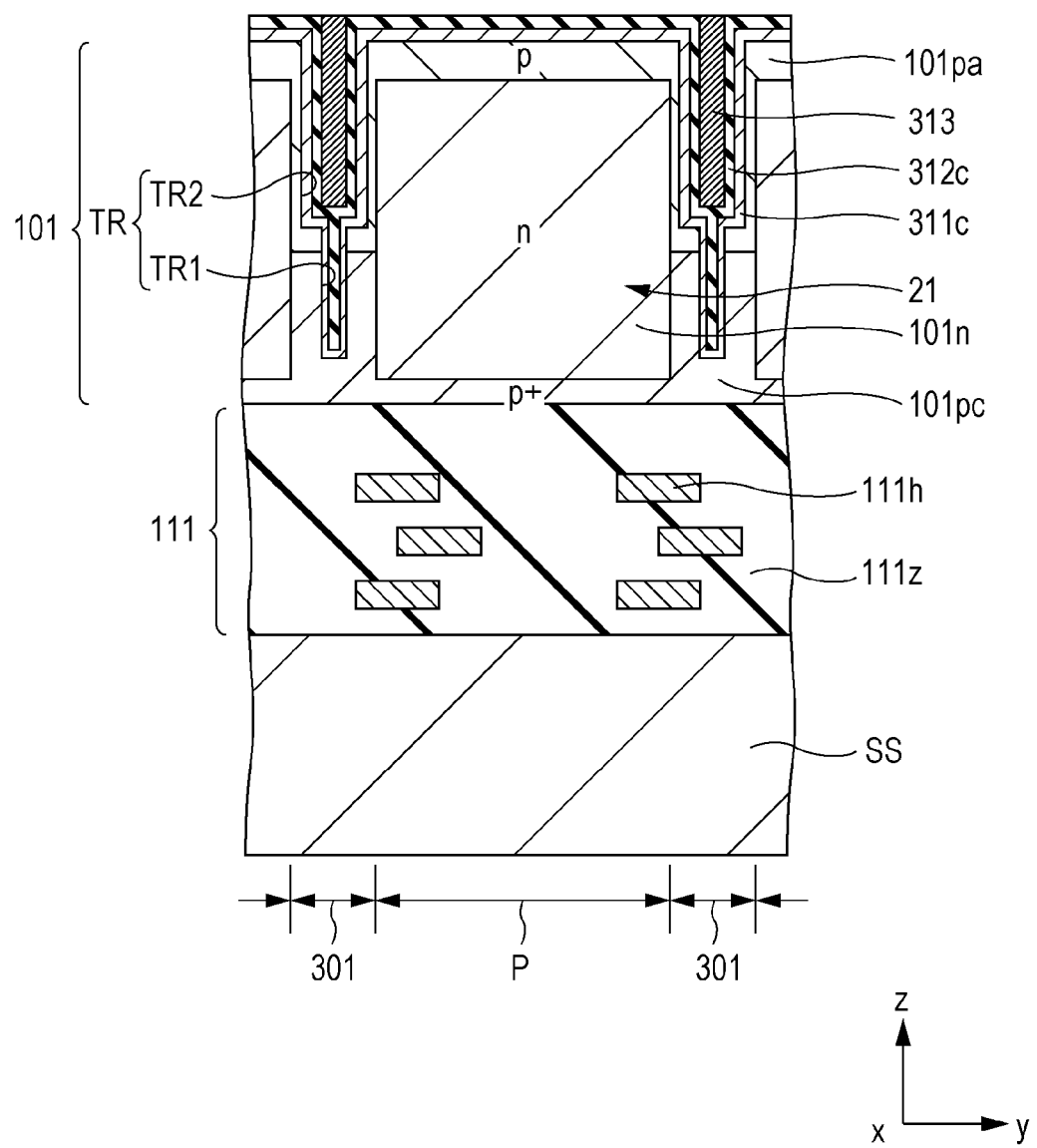
FIG. 18 is a diagram illustrating the method of manufacturing a solid-state imaging device in the third embodiment.

FIGS. 17 and 18 are diagrams illustrating the method of manufacturing the solid-state imaging device in the third embodiment.

Similarly to FIG. 16, each of FIGS. 17 and 18 is illustrated in a cross-section.

In the manufacturing of the solid-state imaging device of the present embodiment, similarly to the case of the first embodiment, the formation of the photodiode 21 or the like, the formation of the second trench TR2, the formation of the first trench TR1, the removal of the hard mask HM and the side wall SW are performed (refer to FIGS. 7 to 10). Thereafter, the solid-state imaging device illustrated in FIG. 16 or the like is formed sequentially through processes illustrated in FIGS. 17 and 18.

Moreover, after the formation of the first trench TR1 is performed through the similar processes as those of the case of the second embodiment, the solid-state imaging device illustrated in FIG. 16 or the like may be formed sequentially through the processes illustrated in FIGS. 17 and 18.

The detail of each process will be sequentially described like the following.

(a) Formation of Pinning Layer 311c and Insulating Layer 312c

As described above, after the first trench TR1, the second trench TR2, and the like are formed, the pinning layer 311c and the insulating layer 312c are formed as illustrated in FIG. 17.

Here, the pinning layer 311c is formed so as to cover the inside surface of each of the first trench TR1 and the second trench TR2.

For example, similarly to the case of the first embodiment, the pinning layer 311c is formed by forming the HfO$_2$ film.

Thereafter, the insulating film 312c is formed so as to bury the inner side portion of the first trench TR1 which is covered by the pinning layer 311c and cover the inside surface of the second trench TR2.

For example, similarly to the case of the first embodiment, the insulating film 312c is formed by forming the SiO$_2$ film.

(b) Formation of Light Shielding Layer 313

Next, the light shielding layer 313 is formed as illustrated in FIG. 18.

Here, similarly to the case of the first embodiment, the light shielding layer 313 is formed so as to bury the inner portion of the second trench TR2 via the pinning layer 311c and the insulating film 312c.

(C) Formation of Color Filter CF and Microlens ML

Next, as illustrated in FIG. 16, each member such as the color filter CF and the microlens ML is formed similarly to the case of the first embodiment.

Thereby, the "rear surface illumination type" CMOS image sensor is completed.

(c) Conclusion

As described above, similarly to the case of the first embodiment, in the present embodiment, the pinning layer 311c is formed in the inner portion of the first trench TR1 so as to cover the inside surface of the second trench TR2. The insulating film 312c is formed so as to cover the inside surface of the second trench TR2 via the pinning layer 311c. In addition, the light shielding layer 313 is formed so as to bury the inner portion of the second trench TR2 via the pinning layer 311c and the insulating film 312c.

Here, the pinning layer 311c is formed so as to cover the inside surface of the first trench TR1. Moreover, the insulating film 312c is formed so as to bury the inner portion of the first trench TR1 via the pinning layer 311c.

Therefore, similarly to the case of the first embodiment, it is possible to improve quality of the captured image in the present embodiment.

Moreover, the insulating film 312c has the effect compensating a pinning property. Thereby, due to the fact that the insulating film 312c is provided in the first trench TR1, a stronger pinning property can be realized.

4. Fourth Embodiment (A) Device Configuration or the Like

Figure 19:
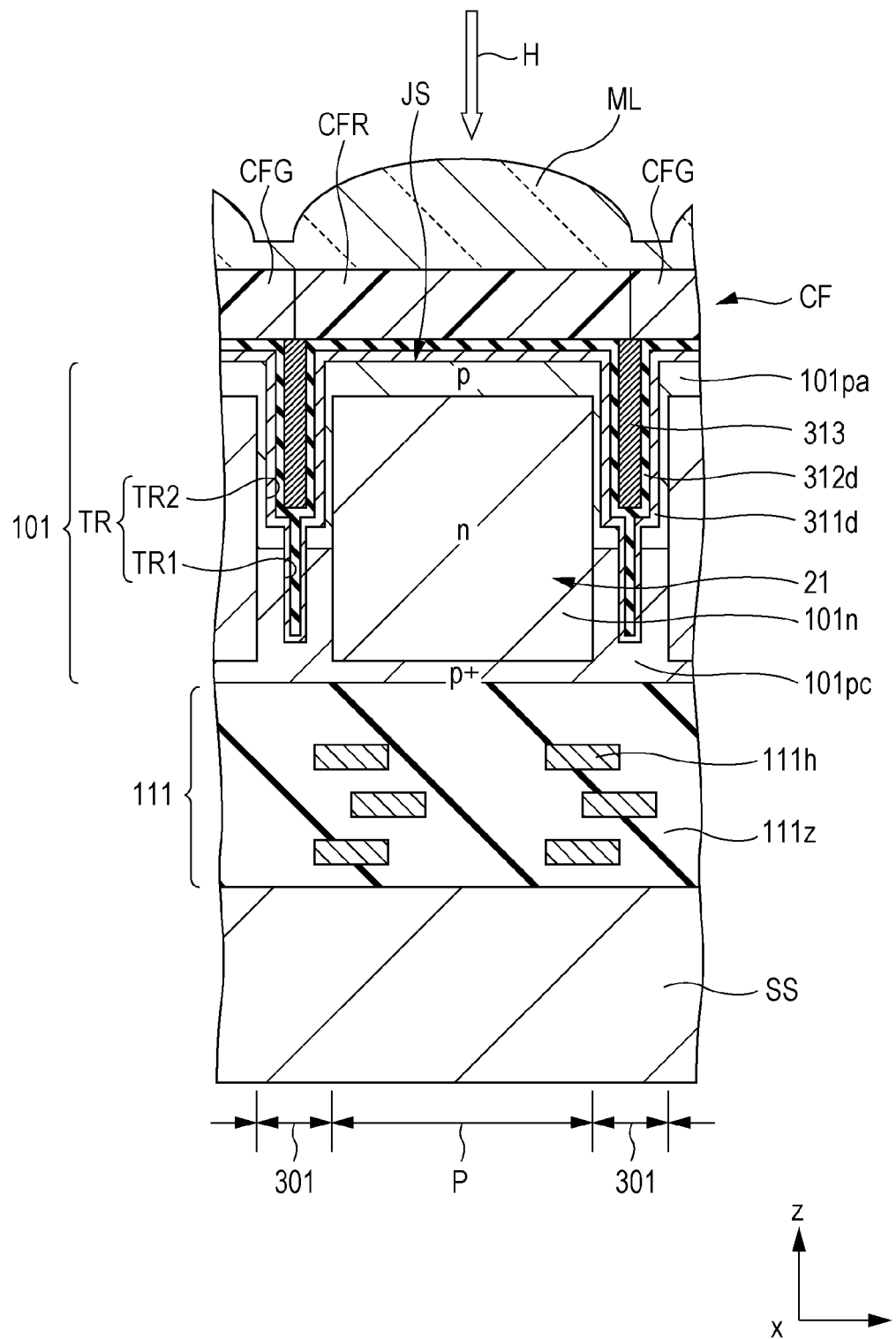
FIG. 19 is a diagram illustrating main portions of a solid-state imaging device in a fourth embodiment.
Figure 20:
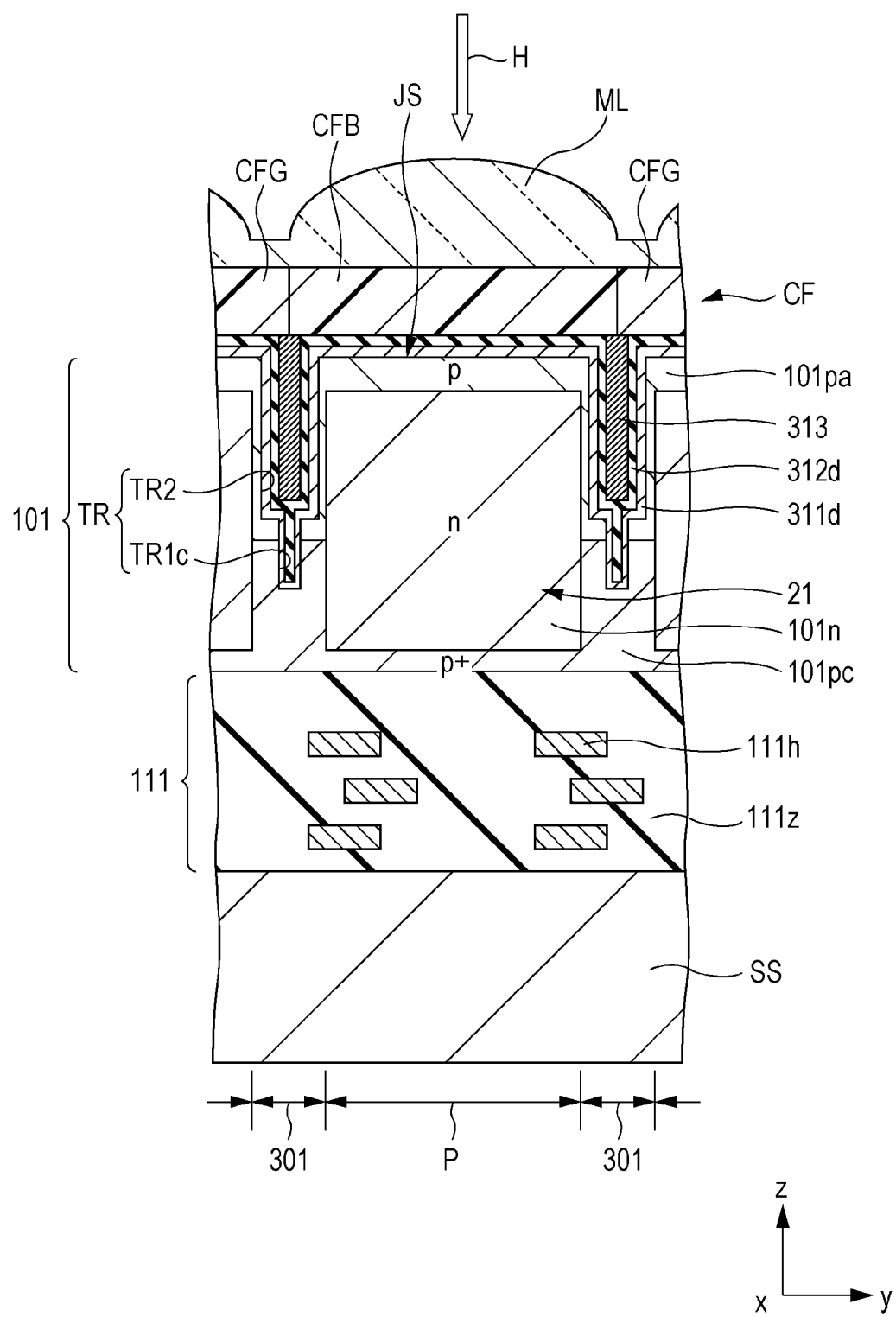
FIG. 20 is a diagram illustrating the main portions of the solid-state imaging device in the fourth embodiment.
Figure 21:
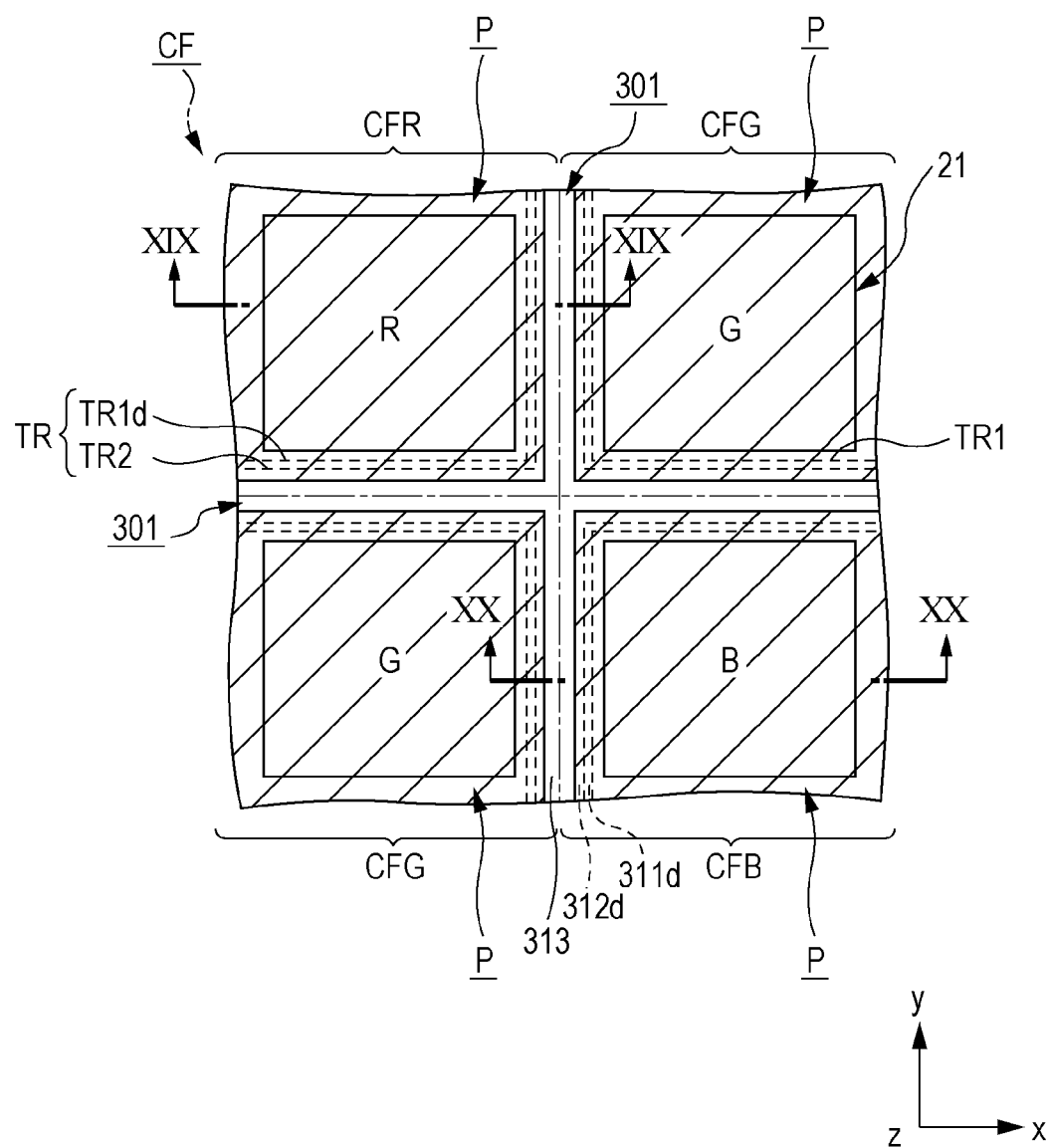
FIG. 21 is a diagram illustrating the main portions of the solid-state imaging device in the fourth embodiment.

FIGS. 19 to 21 are diagrams illustrating main portions of a solid-state imaging device in a fourth embodiment.

Similarly to FIG. 16, FIGS. 19 and 20 are the cross-sectional diagrams of the pixel P. In addition, FIG. 21 is a top view of the pixel P.

Here, FIG. 19 is a cross-sectional diagram taken along a line XIX-XIX illustrated in FIG. 21, and illustrates the cross-section of the pixel P on which the red filter layer CFR is provided in the plurality of pixels P. Other than this, the pixel separation portion 301, which is positioned at the periphery of the pixel P on which the red filter layer CFR is provided, is formed similarly to the case of FIG. 21.

Moreover, FIG. 20 is a cross-sectional diagram taken along a line XX-XX illustrated in FIG. 21, and illustrates the cross-section of the pixel P on which the blue filter layer CFB is provided in the plurality of pixels P. Other than this, in the pixel separation portion 301, portions other than the portion, which is positioned in the periphery of the pixel P on which the red filter layer CFR is provided, are formed similarly to the case of FIG. 21.

Moreover, in FIG. 21 similarly to FIG. 4, for convenience of description, in some cases, portions which illustrate each member are denoted by a broken line or the like other than a solid line.

As illustrated in each of FIGS. 19 to 20, in the present embodiment, in the pixel separation portion 301, the portion which is positioned in the periphery of the pixel P on which the red filter layer CFR is provided and portions other than the portion are different from each other. That is, in other embodiments, the pixel separation portion 301 is formed in the same shape between each pixel P. However, in the present embodiment, the shape of the pixel separation portion 301 is changed according to the wavelength range of the received light in each pixel P. Except for this point and those related to the point, the present embodiment is similar to the first embodiment. Thereby, description is appropriately omitted with respect to the overlapped portions.

In the present embodiment, as illustrated in FIGS. 19 and 20, in the trench TR, the peripheral portion of the photodiode 21 of the pixel P for which the red light is transmitted by the red filter layer CFR is formed up to a deeper portion than the portions between the pixels P which receive other green and blue light. That is, the trench TR in the portion of the periphery of the pixel P, in which the filter layer CFR having higher transmissivity with respect to the wavelength range of the longest wavelength in the plurality of kinds of filter layers CFR, CFG, and CFB is disposed, among the plurality of pixels P is deeper than the trench in the portion of other pixels P.

Here, the first trench TR1*d* (FIG. 19) of the peripheral portion of the pixel P, which receives the red light having the wavelength range of the longest wavelength among the plurality of pixels P, is formed so as to be deeper than the first trench TR1 (FIG. 20) of the other portions.

For example, the depths of the first trenches TR1 and TR1*d* from the rear surface (upper surface) of the semiconductor substrate 101 may be formed so as to satisfy the following conditions. By this way, a blooming characteristic can be preferably obtained.

The portion which is positioned in the periphery of the pixel P on which the red filter layer CFR is provided: 0.2 μm or more (preferably, 1.5 μm or more)

Portions other than the above portion: 0.2 μm or more (preferably, 1.0 μm or more)

Moreover, the pinning layer 311*d* is formed so as to cover the inside surface of the first trench TR1 and TR1*d*. In addition, the insulating film 312*d* is formed so as to bury the inner portion of the first trench TR1 via the pinning layer 311*c*.

(B) Conclusion

As described above, similarly to the third embodiment, in the present embodiment, the pinning layer 311*d* is formed in the inner portion of the first trench TR1 so as to cover the inside surface of the second trench TR2. The insulating film 312*d* is formed so as to cover the inside surface of the second trench TR2 via the pinning layer 311*d*. In addition, the light shielding layer 313 is formed so as to bury the inner portion of the second trench TR2 via the pinning layer 311*d* and the insulating film 312*d*.

Therefore, similarly to the case of the third embodiment, in the present embodiment, it is possible to improve quality of the captured image.

Moreover, in the present embodiment, the trench TR in the portion of the periphery of the pixel P, in which the filter layer CFR having higher transmissivity with respect to the wavelength range of the longest wavelength in the plurality of kinds of filter layers CFR, CFG, and CFB is disposed, is deeper than the trench in the portion of other pixels P. In addition, the pinning layer 311*d*, the insulating film 312*d*, and the light shielding layer 313 are provided in the trench TR.

In the semiconductor substrate 101 which is formed of a single crystal silicon semiconductor, the light of the shorter wavelength like the blue light is absorbed in the vicinity of the surface into which the light enters. However, the light having the longer wavelength like the red light reaches the deeper portion of the semiconductor substrate 101. In contrast, in the present embodiment, the pinning layer 311*d* and the insulating film 312*d* in the periphery of the photodiode 21 which receives the light having the longer wavelength like the red light are formed up to a deeper position than the periphery of the photodiode 21 which receives other light having the shorter wavelength.

Thereby, in the present embodiment, even when the light having the longer wavelength reaches the deeper portion of the semiconductor substrate 101 and an electric charge is generated, the pixel separation portion 301 can electrically separate between the plurality of pixels P with effect.

In addition, the trench TR is formed so as to be shallower in the portions other than the portion of the periphery of the pixel P, in which the filter layer CFR having higher transmissivity with respect to the light of the wavelength range of the longest wavelength is positioned, among the plurality of pixels P. In the case where a deep trench TR is formed, damage due to the etching processing or the like may be great. However, the damage can be decreased in the shallower portion.

Therefore, in the present embodiment, it is possible to further improve quality of the captured image.

In addition, in the above-described embodiment, similarly to the case of the third embodiment, the case where the pinning layer 311*d* and the insulating film 312*d* are provided in the inner portion of the first trenches TR1 and TR1*d* is described. However, the present disclosure is not limited thereto. That is, similarly to the cases of the first and second embodiments, only the pinning layer 311 may be provided in the inner portion of the first trenches TR1 and TR1*d*.

In addition, in the present embodiment, unlike the first trenches TR1 and TR1*d* of the lower stage which are different from each other, the peripheral portion of the pixel P which receives the red light and other portions have the same depth as each other in the second trench TR2 of the upper stage. However, the present disclosure is not limited thereto. Similarly to the first trenches TR1 and TR1*d* of the lower stage, also in the second trenches TR2 of the upper stage, the peripheral portion of the pixel P which receives the red light may be formed so as to be deeper than other portions.

For example, the depth of the second trench TR2 from the rear surface (upper surface) of the semiconductor substrate 101 may be formed so as to be the following condition.

The portion which is positioned in the periphery of the pixel P on which the red filter layer CFR is provided: 0.2 to 4 μm (preferably, 1.0 μm or more)

Portions other than the above portion: 0.2 to 4 μm or more (preferably, 0.5 μm or more)

5. Fifth Embodiment (A) Device Configuration or the Like

Figure 22:
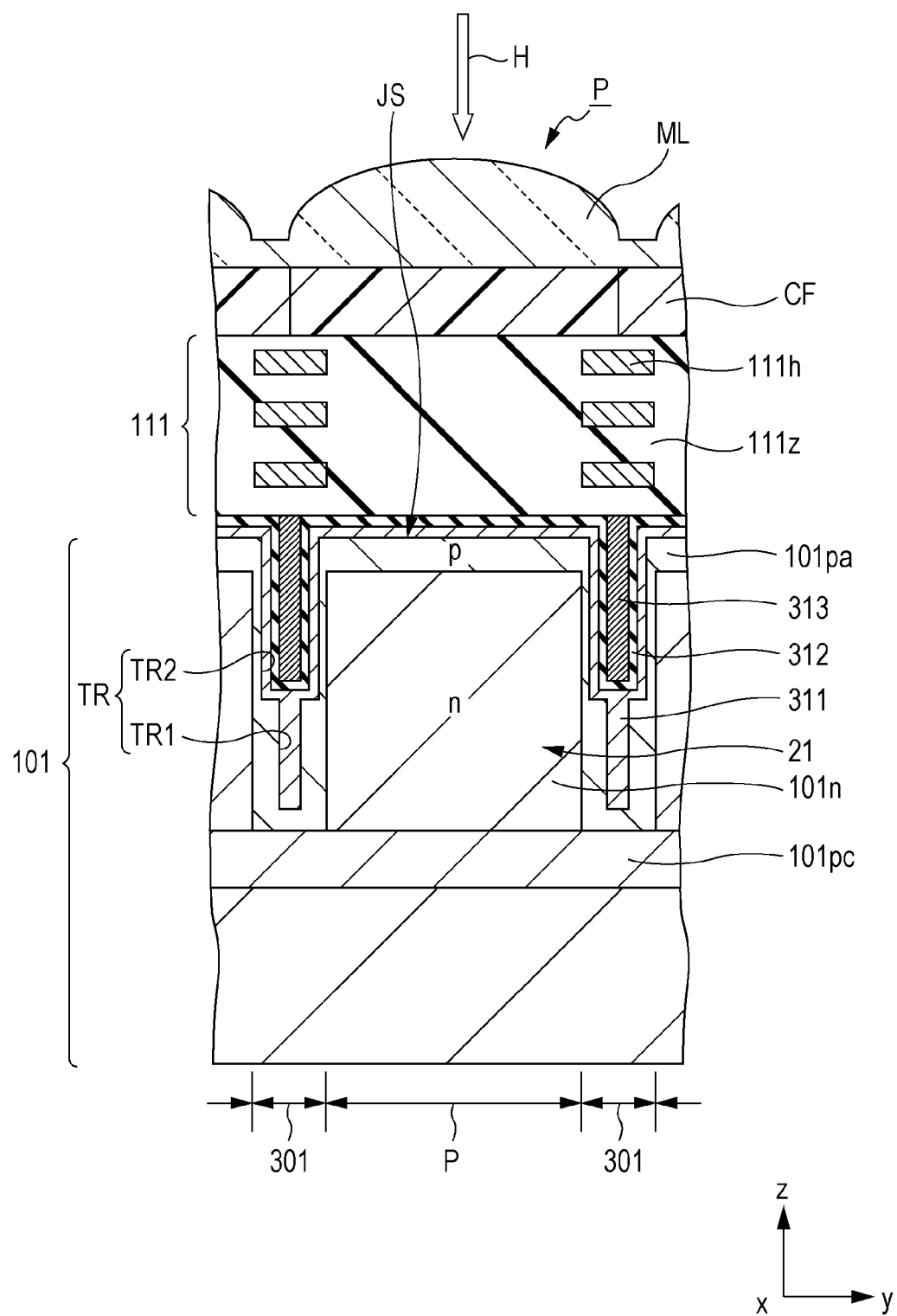
FIG. 22 is a diagram illustrating main portions of a solid-state imaging device in a fifth embodiment.

FIG. 22 is a diagram illustrating main portions of a solid-state imaging device in a fifth embodiment.

FIG. 22 illustrates the cross-section of the pixel P similarly to FIG. 3.

As illustrated in FIG. 22, the solid-state imaging device of the present embodiment is a "front surface illumination type". That is, the wiring layer 111 is provided on the front surface (upper surface in FIG. 22) side of the semiconductor substrate 101, and the light sensing surface JS receives the incident light H which enters from the front surface side. Moreover, the pixel separation 301 is provided on the front surface (upper surface) side of the semiconductor substrate 101. In addition, the semiconductor substrate 101 is not thinned, and the supporting substrate SS (refer to FIG. 3) is not provided. Except for this point and those related to the point, the present embodiment is similar to the first embodiment. Thereby, description is appropriately omitted with respect to the overlapped portions.

In the present embodiment, as illustrated in FIG. 22, in the solid-state imaging device, the photodiode 21 and the pixel separation portion 301 are provided in the inner portion of the semiconductor substrate 101.

As illustrated in FIG. 22, the photodiode 21 is provided so that the n-type semiconductor region 101n is positioned in the inner portion of the p-type semiconductor regions 101pa and 101pc at the front surface (upper surface) side of the semiconductor substrate 101.

As illustrated in FIG. 22, the pixel separation portion 301 is configured similarly to the first embodiment. That is, the pixel separation 301 includes the pinning layer 311, the insulating film 312, and the light shielding layer 313, and each of the portions is provided in the inner portion of the trench TR.

In the wiring layer 111, the wirings 111h are provided on a portion other than the upper portion of the light sensing surface JS in the insulating layer 111z.

Moreover, similarly to the first embodiment, the color filter CF and the microlens ML are provided on the upper surface of the wiring layer 111.

Although not illustrated in FIG. 22, the pixel transistor Tr illustrated in FIG. 5 is provided on the front surface (upper surface) of the semiconductor substrate 101. The wiring layer 111 is provided so as to cover the pixel transistor Tr.

In the present embodiment, similarly to the first embodiment, when the image device is manufactured, the p-type semiconductor region 101pa, the p-type semiconductor region 101pc, and the n-type semiconductor region 101n are formed by ion-implanting impurities from the front surface of the semiconductor substrate 101. Moreover, similarly to the first embodiment, the trench TR is formed on the front surface side of the semiconductor substrate 101. In addition, similarly to the first embodiment, the pinning layer 311, the insulating film 312, and the light shielding layer 313 are formed in the trench TR. Moreover, after the pixel transistor Tr is formed on the front surface of the semiconductor substrate 101, the wiring layer 111 is formed so as to cover the pixel transistor Tr. In addition, the color filter CF and the microlens ML are formed, and the "front surface illumination type" CMOS image sensor is completed.

(B) Conclusion

As described above, in the present embodiment, similarly to the case of the first embodiment, the pixel separation portion 301 includes the pinning layer 311, the insulating film 312, and the light shielding layer 313, and each of the portions is provided in the inner portion of the trench TR (refer to FIG. 22).

Therefore, similarly to the first embodiment, it is possible to improve quality of the captured image in the present embodiment.

As described above, the solid-state imaging device of the present embodiment is the "front surface illumination type". In the case of the "front surface illumination type", when the pixel separation portion is provided by ion-implanting impurities having a high concentration from the front surface side into which the incident light enters, particularly, it is difficult to improve the saturation charge accumulation amount (Qs) of the pixel which receives the light having the longer wavelength like the red. The reason is that the width of the pixel separation portion, which becomes the impurity region having a high concentration in the rear surface (lower surface) side of the semiconductor substrate 101, is easily widened considering the diffusion of impurities.

However, in the present embodiment, the pixel separation portion 301 is embedded to the inner portion of the trench TR provided in the side portion of the photodiode 21 in the semiconductor substrate 101. Thereby, since the pixel P is separated in the deeper region with respect to the light sensing surface JS, particularly, it is possible to increase the saturation charge accumulation amount (Qs) in the photodiode 21 which receives the red light, and a dynamic range can be improved.

Moreover, in the present embodiment, the case where the pixel separation portion 301 is configured so as to be the same as the case of the first embodiment is described. However, the present disclosure is not limited thereto, and the pixel separation portion 301 may be configured like the other embodiments.

6. Others

When the present disclosure is performed, the present disclosure is not limited to the above-described embodiments. That is, the present disclosure can adopt various modifications.

In the above-described embodiments, the case where the present disclosure is applied to the camera is described. However, the present disclosure is not limited thereto. That is, the present disclosure may be also applied to other electronic apparatuses including a solid-state imaging device such as a scanner or a copier.

In the above-described embodiments, the case where four kinds of the transfer transistor, the amplifying transistor, the selection transistor, and the reset transistor are provided as the pixel transistor is described. However, the present disclosure is not limited thereto. For example, the present disclosure may be also applied to a case where three kinds of the transfer transistor, the amplifying transistor, and the reset transistor are provided as the pixel transistor.

In the above-described embodiments, the case where each of the transfer transistor, the amplifying transistor, the selection transistor, and the reset transistor is provided to one photodiode one by one is described. However, the present disclosure is not limited thereto. For example, the present disclosure may be also applied to a case where each of the amplifying transistor, the selection transistor, and the reset transistor is provided to a plurality of photodiodes one by one.

Moreover, the present disclosure may be applied to a CCD type image sensor in addition to the CMOS type image sensor.

Moreover, in the above described embodiment, the case where the pixel separation portion 301 includes the insulating film 312 is described. However, the present disclosure is not limited thereto. The insulating film 312 may not provided.

Moreover, in the manufacturing of the solid-state imaging device, when the trench TR is formed in the portion which forms the pixel separation portion 301, the trench may be simultaneously formed with respect to other portions. For example, when the surface of a pad electrode (not illustrated) formed similarly to the wirings 111h is exposed in the wiring layer 111, the trench may be formed on the upper portion of the surface in the same process as the above one. By this way, it is possible to further improve the producibility.

Moreover, in the above, the case where the trench TR includes a two-stage structure is described. However, the present disclosure is not limited thereto. The trench TR including the stages having three or more may be configured. In this case, for example, the pixel separation portion is provided by embedding the light shielding layer into the uppermost stage and the pinning layer or the insulating film into the states other than the uppermost stage.

In addition, the above-described embodiments may be appropriately combined.

That is, the present disclosure may include the following configurations.

(1) According to an embodiment of the present disclosure, there is provided a solid-state imaging device including a plurality of photoelectric conversion portions each provided to correspond to each of a plurality of pixels in a semiconductor substrate and receives incident light through a light sensing surface, and a pixel separation portion that is provided between the plurality of pixels in an inner portion of the semiconductor substrate and electrically separates the plurality of pixels, wherein at least a pinning layer and a light shielding layer that are provided in an inner portion of a trench which is provided on a side portion of each of the photoelectric conversion portions in an incident surface side of the semiconductor substrate into which the incident light enters, the trench includes a first trench and a second trench having a width wider than that of the first trench in a portion shallower than the first trench in the semiconductor substrate, the pinning layer is formed in an inner portion of the first trench so as to cover an inside surface of the second trench, and the light shielding layer is formed so as to bury an inner portion of the second trench at least via the pinning layer.

(2) In the solid-state imaging device described in (1), the pinning layer may be formed so as to bury the entire inner portion of the first trench.

(3) In the solid-state imaging device described in (2), the solid-state imaging device may further include an insulating film that is formed so as to cover the inside surface of the second trench via the pinning layer, and the light shielding layer may be formed so as to bury the inner portion of the second trench via the pinning layer and the insulating film.

(4) In the solid-state imaging device described in (1), the solid-state imaging device may further includes an insulating film that is formed so as to cover the inner surface of the second trench via the pinning layer, the pinning layer may be formed so as to cover the inside surface of the first trench, the insulating film may be formed so as to bury the inner portion of the first trench via the pinning layer, and the light shielding layer may be formed so as to bury the inner portion of the second trench via the pinning layer and the insulating film.

(5) In the solid-state imaging device described in any one of (1) to (4), the pinning layer may be formed of a material which includes a negative fixed charge.

(6) In the solid-state imaging device described in any one of (1) to (5), the pinning layer may be formed by using hafnium oxide, tantalum pentoxide, or aluminum oxide.

(7) In the solid-state imaging device described in any one of (1) to (6), the light shielding layer may be formed by using aluminum or tungsten.

(8) In the solid-state imaging device described in any one of (1) to (7), the solid-state imaging device may further include a pixel transistor that is provided on a surface of a side opposite to the incident surface in the semiconductor substrate and outputs a signal charge generated by the photoelectric conversion portion as an electric signal, and a wiring layer that is provided so as to cover the pixel transistor in the surface of the side opposite to the incident surface in the semiconductor substrate.

(9) In the solid-state imaging device described in any one of (1) to (8), the solid-state imaging device may further include a color filter that transmits the incident light to the light sensing surface, wherein a plurality of kinds of filter layers having a high transmissivity to light of wavelength ranges different from one another may be disposed so as to be adjacent to one another corresponding to each of the plurality of pixels in the color filter, and the trench in a periphery of the pixel P, in which a filter layer having higher transmissivity with respect to light of the wavelength range of the longest wavelength in the plurality of kinds of filter layers is positioned, among the plurality of pixels P may be formed so as to be deeper than the trenches in other portions.

(10) According to another embodiment of the present disclosure, there is provided a method of manufacturing a solid-state imaging device including providing a plurality of photoelectric conversion portions which receive incident light through a light sensing surface so as to correspond to a plurality of pixels in a semiconductor substrate, and forming a pixel separation portion, which electrically separates the plurality of pixels, between the plurality of pixels in an inner portion of the semiconductor substrate, the forming of the pixel separation includes providing at least a pinning layer and a light shielding layer in an inner portion of a trench which is provided on a side portion of each of the photoelectric conversion portions in an incident surface side of the semiconductor substrate into which the incident light enters, a first trench and a second trench having a width wider than that of the first trench in a portion shallower than the first trench in the semiconductor substrate are formed as the trench, the pinning layer is formed so as to cover an inner portion of the first trench and an inside surface of the second trench, and the light shielding layer is formed so as to bury an inner portion of the second trench at least via the pinning layer.

(11) According to still another embodiment, there is provided an electronic apparatus including a plurality of photoelectric conversion portions each provided to correspond to each of a plurality of pixels in a semiconductor substrate and receives incident light through a light sensing surface, and a pixel separation portion that is provided between the plurality of pixels in an inner portion of the semiconductor substrate and electrically separates the plurality of pixels, wherein at least a pinning layer and a light shielding layer that are provided in an inner portion of a trench which is provided on a side portion of each of the photoelectric conversion portions in an incident surface side of the semiconductor substrate into which the incident light enters, the trench includes a first trench and a second trench having a width wider than that of the first trench in a portion shallower than the first trench in the semiconductor substrate, the pinning layer is formed in an inner portion of the first trench so as to cover an inside surface of the second trench, and the light shielding layer is formed so as to bury an inner portion of the second trench at least via the pinning layer.

Moreover, in the above-described embodiments, the photodiode 21 is an example of the photoelectric conversion portion. In addition, in the above-described embodiments, the camera 40 is an example of the electric apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. An electric apparatus, comprising:
    an optical system;
    a signal processing portion; and
    an imaging device, comprising:
        a semiconductor substrate including a first side as a light-incident side and a second side opposite to the first side;
        a plurality of photoelectric conversion portions disposed in the semiconductor substrate;
        a trench having a lattice shape in a plan view, wherein at least part of the trench is disposed between adjacent photoelectric conversion portions of the plurality of photoelectric conversion portions, the at least part of the trench including:
        a first portion including a first layer including hafnium oxide, tantalum pentoxide or aluminum oxide,
        a second portion including the first layer and an insulating layer disposed on the first layer, and
        a silicon oxide layer disposed between the semiconductor substrate and the first layer in the first portion, wherein,
        a width of the first portion is smaller than a width of the second portion in a cross-section view,
        the optical system focuses an incident light on the imaging device, and
        the signal processing portion receives and processes a signal from the imaging device.

2. The electric apparatus according to claim 1, wherein the insulating layer is in direct contact with an entirety of an inner side of the first layer in the second portion.

3. The electric apparatus according to claim 1, wherein the first layer is selected from the group consisting of hafnium oxide, zirconium dioxide, aluminum oxide, neodymium oxide, tantalum pentoxide, lanthanum oxide, praseodymium oxide, promethium oxide, samarium oxide, europium oxide, gadolinium oxide, terbium oxide, dysprosium oxide, holmium oxide, erbium oxide, thulium oxide, ytterbium oxide, lutetium oxide or yttrium oxide, and combinations thereof.

4. The electric apparatus according to claim 1, further comprising:
    a pixel including at least one of the photoelectric conversion portions and a pixel transistor, wherein the pixel transistor and a wiring layer are disposed at the second side of the semiconductor substrate, wherein the first portion is disposed closer to the second side of the semiconductor substrate than the second portion.

5. The electric apparatus according to claim 4, wherein the pixel transistor includes at least a reset transistor, an amplification transistor, and a transfer transistor.

6. The electric apparatus according to claim 1, wherein a light-shielding portion is disposed corresponding to the trench.

7. The electric apparatus according to claim 1, wherein at least one of the photoelectric conversion portions includes a hole accumulation diode structure.

8. The electric apparatus according to claim 1, wherein a thickness of the insulating layer is 5 µm or less.

9. The electric apparatus according to claim 1, wherein the first layer comprises hafnium oxide that extends outside of the trench to a surface of the semiconductor substrate.

10. An electric apparatus, comprising:
    an optical system;
    a signal processing portion; and
    an imaging device comprising:
        a plurality of photoelectric conversion portions disposed in a semiconductor substrate;
        a trench having a lattice shape in a plan view, wherein at least part of the trench is disposed between adjacent photoelectric conversion portions of the plurality of photoelectric conversion portions, the at least part of the trench including:
        a first portion including a first layer including hafnium oxide, tantalum pentoxide or aluminum oxide,
        a second portion including the first layer and an insulating layer disposed on the first layer, and
        a silicon oxide layer disposed between the semiconductor substrate and the first layer in the first portion, wherein,
        a width of the first portion is smaller than a width of the second portion in a cross-section view,
        the optical system focuses an incident light on the imaging device, and
        the signal processing portion receives and processes a signal from the imaging device.

11. The electric apparatus according to claim 10, wherein the semiconductor substrate comprises a first side as a light-incident side and a second side opposite to the first side, wherein the plurality of photoelectric conversion portions are disposed in the semiconductor substrate, wherein the first layer is disposed at the first side of the semiconductor substrate, and wherein the insulating layer is disposed on the first layer at the first side of the semiconductor substrate.

12. The electric apparatus according to claim 11, wherein the insulating layer is in direct contact with an entirety of an inner side of the first layer in the second portion.

13. The electric apparatus according to claim 10, wherein the first layer is selected from the group consisting of hafnium oxide, zirconium dioxide, aluminum oxide, neodymium oxide, tantalum pentoxide, lanthanum oxide, praseodymium oxide, promethium oxide, samarium oxide, europium oxide, gadolinium oxide, terbium oxide, dysprosium oxide, holmium oxide, erbium oxide, thulium oxide, ytterbium oxide, lutetium oxide or yttrium oxide, and combinations thereof.

14. The electric apparatus according to claim 10, further comprising:
    a pixel including at least one of the photoelectric conversion portions and a pixel transistor, wherein the pixel transistor and a wiring layer are disposed at the second side of the semiconductor substrate, wherein the first portion is disposed closer to the second side of the semiconductor substrate than the second portion.

15. The electric apparatus according to claim 14, wherein the pixel transistor includes at least a reset transistor, an amplification transistor, and a transfer transistor.

16. The electric apparatus according to claim 10, wherein a light-shielding portion is disposed corresponding to the trench.

17. The electric apparatus according to claim 10, wherein at least one of the photoelectric conversion portions includes a hole accumulation diode structure.

18. The electric apparatus according to claim 10, wherein a thickness of the insulating layer is 5 μm or less.

19. The electric apparatus according to claim 10, wherein the first layer comprises hafnium oxide that extends outside of the trench to a surface of the semiconductor substrate.

20. An electric apparatus, comprising:
   an optical system;
   a signal processing portion; and
   an imaging device comprising:
      a semiconductor substrate including a first side as a light-incident side and a second side opposite to the first side;
      a plurality of photoelectric conversion portions disposed in the semiconductor substrate;
      a trench having a lattice shape in a plan view, wherein at least part of the trench is disposed between adjacent photoelectric conversion portions of the plurality of photoelectric conversion portions, the at least part of the trench including:
      a first portion including a first layer including hafnium oxide, tantalum pentoxide or aluminum oxide,
      a second portion including the first layer and an insulating layer, and
      a silicon oxide layer disposed between the semiconductor substrate and the first layer in the first portion, wherein,
      a width of the first portion is smaller than a width of the second portion in a cross-section view,
      the optical system focuses an incident light on the imaging device, and
      the signal processing portion receives and processes a signal from the imaging device.

* * * * *